(12) United States Patent
Hieno et al.

(10) Patent No.: US 9,608,203 B2
(45) Date of Patent: Mar. 28, 2017

(54) METHOD FOR MANUFACTURING MEMORY DEVICE AND METHOD FOR MANUFACTURING METAL WIRING

(71) Applicant: Kabushiki Kaisha Toshiba, Minato-ku (JP)

(72) Inventors: Atsushi Hieno, Kawasaki (JP); Koji Asakawa, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/842,234

(22) Filed: Sep. 1, 2015

(65) Prior Publication Data

US 2016/0087206 A1 Mar. 24, 2016

(30) Foreign Application Priority Data

Sep. 22, 2014 (JP) .................................. 2014-193109

(51) Int. Cl.
  *H01L 27/24* (2006.01)
  *H01L 45/00* (2006.01)

(52) U.S. Cl.
  CPC ...... *H01L 45/1233* (2013.01); *H01L 27/2436* (2013.01); *H01L 27/2463* (2013.01);
  (Continued)

(58) Field of Classification Search
  None
  See application file for complete search history.

(56) References Cited

U.S. PATENT DOCUMENTS 8,114,468 B2 * 2/2012 Sandhu ................. H01L 27/101
                                                       257/4
8,790,522 B1 * 7/2014 Schmid ............... H01L 21/0337
                                                       216/17
(Continued)

FOREIGN PATENT DOCUMENTS

JP   2001-100419   4/2001
JP   2010-512018   4/2010
(Continued)

OTHER PUBLICATIONS

Ron Chen, et al., "Chemistry for Positive Pattern Transfer Using Area-Selective Atomic Layer Deposition", Advanced Materials, DOI:10.1002/adma.200502470, 2006, (18), 5 pgs.
(Continued)

*Primary Examiner* — Andres Munoz
(74) *Attorney, Agent, or Firm* — Oblon, McClelland, Maier & Neustadt, L.L.P.

(57) ABSTRACT

A method for manufacturing a memory device of an embodiment includes: forming on a substrate a block copolymer layer which contains a first polymer and a second polymer having lower surface energy than that of the first polymer; performing thermal treatment on the block copolymer layer, to separate the block copolymer layer such that a first phase containing the first polymer and extending in the first direction and a second phase containing the second polymer and extending in the first direction are alternately arrayed; selectively forming on the first phase a first metal wiring layer extending in the first direction; forming on the first metal wiring layer a memory layer where resistance changes by application of a voltage; and forming on the memory layer a second metal wiring layer which extends in a second direction intersecting in the first direction.

15 Claims, 30 Drawing Sheets

(52) U.S. Cl.
CPC .............. *H01L 45/04* (2013.01); *H01L 45/14* (2013.01); *H01L 45/1666* (2013.01)

(56) References Cited

U.S. PATENT DOCUMENTS

| | | |
|---|---|---|
| 2008/0193658 A1 | 8/2008 | Millward |
| 2008/0233323 A1* | 9/2008 | Cheng .................... B29D 22/00 428/36.91 |
| 2010/0065803 A1 | 3/2010 | Choi et al. |
| 2010/0151188 A1 | 6/2010 | Ishizuka et al. |
| 2011/0198736 A1 | 8/2011 | Shero et al. |
| 2012/0052598 A1 | 3/2012 | Buckley et al. |
| 2012/0058435 A1* | 3/2012 | Seino .................... G03F 7/0755 430/324 |
| 2012/0326223 A1* | 12/2012 | Omura ............... H01L 27/11565 257/324 |
| 2013/0078570 A1* | 3/2013 | Hieno ...................... B32B 7/04 430/270.1 |
| 2013/0248962 A1 | 9/2013 | Morota et al. |
| 2014/0322917 A1* | 10/2014 | Abdallah ............ H01L 21/3081 438/703 |
| 2015/0076436 A1* | 3/2015 | Sills .................... H01L 45/1233 257/3 |

FOREIGN PATENT DOCUMENTS

| | | |
|---|---|---|
| JP | 2010-142881 | 7/2010 |
| JP | 2010-522643 | 7/2010 |
| JP | 2010-285686 | 12/2010 |
| JP | 2012-015497 | 1/2012 |
| JP | 2013-027964 | 2/2013 |
| JP | 2013-041942 | 2/2013 |
| JP | 2013-520028 | 5/2013 |
| JP | 2013-197363 | 9/2013 |

OTHER PUBLICATIONS

Qing Peng, et al., "Nanoscopic Patterned Materials with Tunable Dimensions via Atomic Layer Deposition on Block Copolymers", Advance Materials, DOI: 10.1002/adma.201002465, 2010, (22), 5 pgs.

* cited by examiner

SECOND DIRECTION →

FIRST DIRECTION ↑

A — A

20

20, 18, 18a, 18b, 10

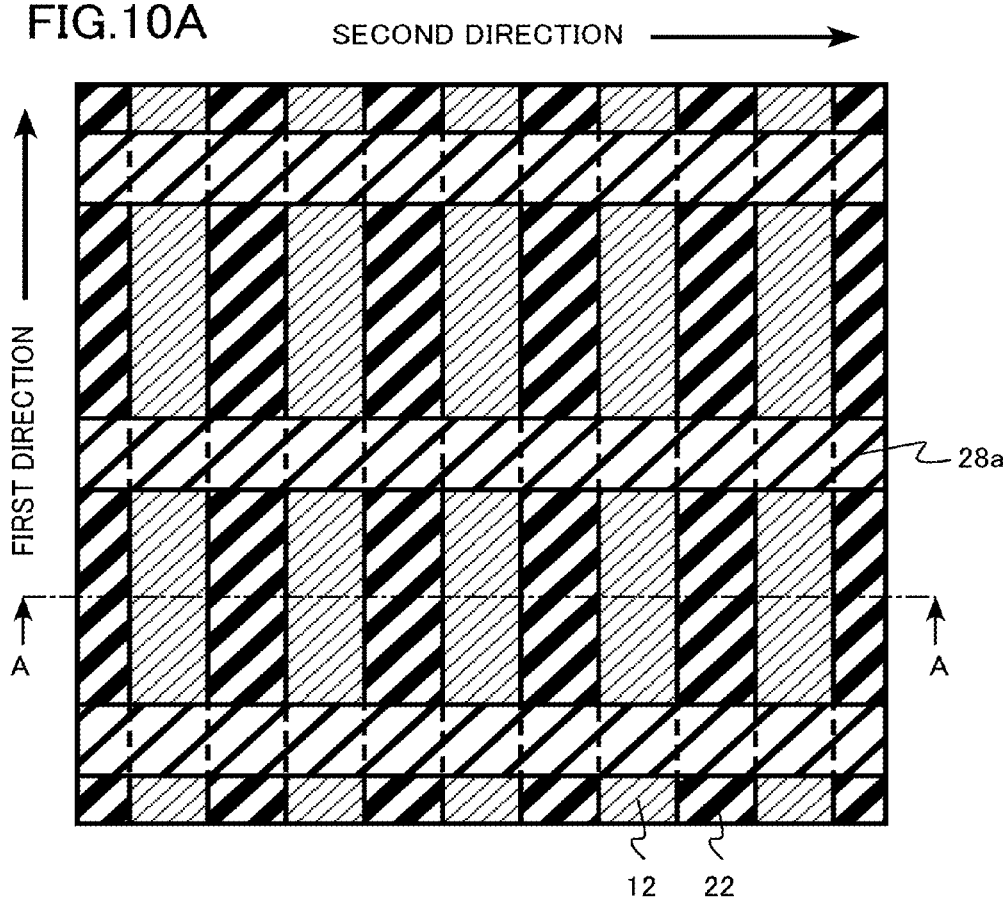
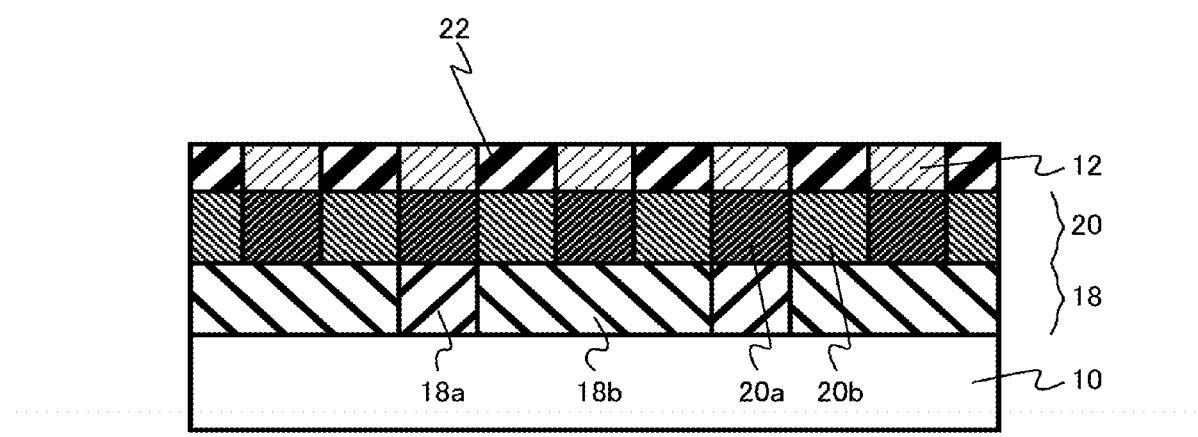

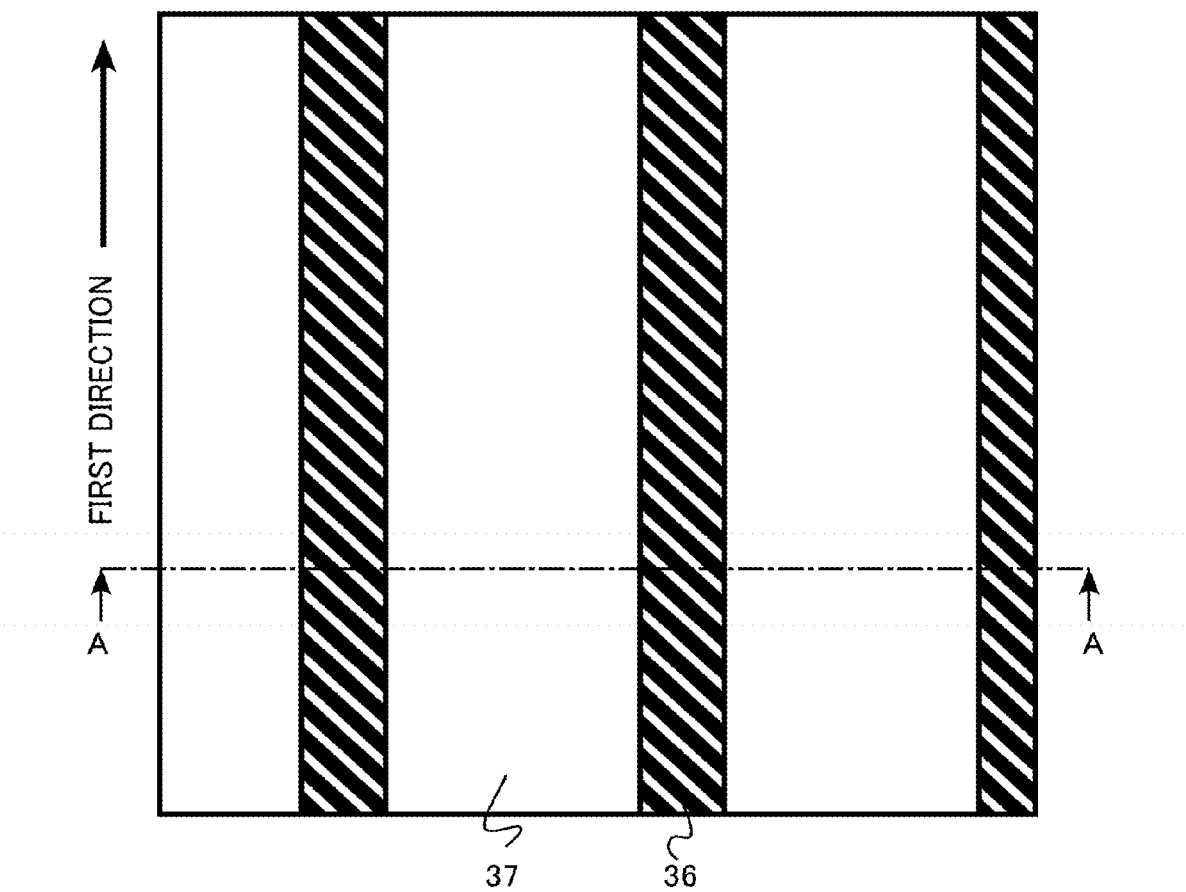
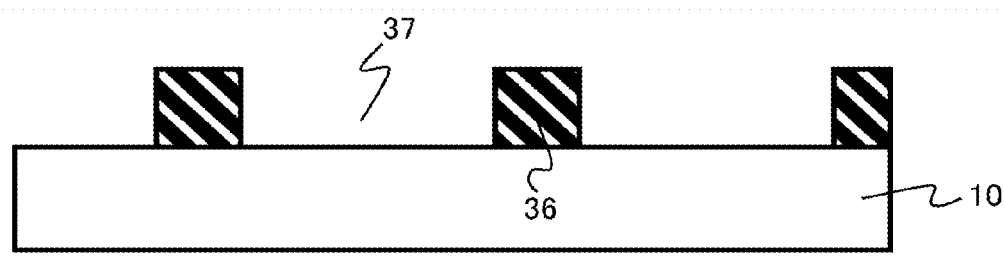

METHOD FOR MANUFACTURING MEMORY DEVICE AND METHOD FOR MANUFACTURING METAL WIRING

CROSS-REFERENCE TO RELATED APPLICATION

This application is based upon and claims the benefit of priority from Japanese Patent Application No. 2014-193109, filed on Sep. 22, 2014, the entire contents of which are incorporated herein by reference.

FIELD

Embodiments described herein relate generally to a method for manufacturing memory device and a method for manufacturing metal wiring.

BACKGROUND

For example, in order to realize low cost of a memory device such as nonvolatile semiconductor memory device, a method for scaling-down a size of a memory cell has prevailed. However, there are increasing technical difficulties in scaling down the memory cell.

Then, for realizing cost reduction, it has been desired to reduce the number of high-cost steps such as lithography, film deposition and etching.

BRIEF DESCRIPTION OF THE DRAWINGS

FIGS. 10A and 10B are schematic views showing the memory device in the middle of manufacturing in the method for manufacturing the memory device of the first embodiment;

FIGS. 17A and 17B are schematic views showing a memory device in the middle of manufacturing in a method for manufacturing a memory device of a second embodiment;

DETAILED DESCRIPTION

A method for manufacturing a memory device of an embodiment includes: forming a block copolymer layer on a substrate, the block copolymer layer containing a first polymer and a second polymer having lower surface energy than that of the first polymer; performing thermal treatment on the block copolymer layer, the thermal treatment separating the block copolymer layer such that a first phase containing the first polymer and extending in the first direction and a second phase containing the second polymer and extending in the first direction are alternately arrayed; forming a first metal wiring layer selectively on the first phase, the first metal wiring layer extending in the first direction; forming a memory layer on the first metal wiring layer, resistance of the memory layer being changed by application of a voltage; and forming a second metal wiring layer on the memory layer, the second metal wiring layer extending in a second direction, the second direction intersecting the first direction.

In the present specification, the same or similar members may be provided with the same numeral, and a repeated description may be omitted.

In the present specification, "upper" and "lower" are used for indicating the relative positional relation of a component or the like. In the present specification, concepts of "upper" and "lower" are not necessarily terms indicating relations with the gravity direction.

Hereinafter, embodiments will be described with reference to the drawings.

First Embodiment

A method for manufacturing a memory device of the present embodiment includes: forming on a substrate a block copolymer layer which contains a first polymer and a second polymer having lower surface energy than that of the first polymer; performing thermal treatment on the block copolymer layer, to separate the block copolymer layer such that a first phase containing the first polymer and extending in the first direction and a second phase containing the second polymer and extending in the first direction are alternately arrayed; selectively forming on the first phase a first metal wiring layer extending in the first direction; forming on the first metal wiring layer a memory layer where resistance changes by application of a voltage; and forming on the memory layer a second metal wiring layer which extends in a second direction intersecting in the first direction.

In a method for manufacturing a memory device of the present embodiment, metal wiring of a memory cell array is formed by using a block copolymer as a self-assembling material. By forming the memory cell array in a bottom-up manner with the block copolymer taken as a starting point, it is possible to reduce the number of complex steps and high-cost steps, so as to make the manufacturing process simplified and low-cost. Hence it is possible to manufacture the memory device at low cost.

Figure 1A:
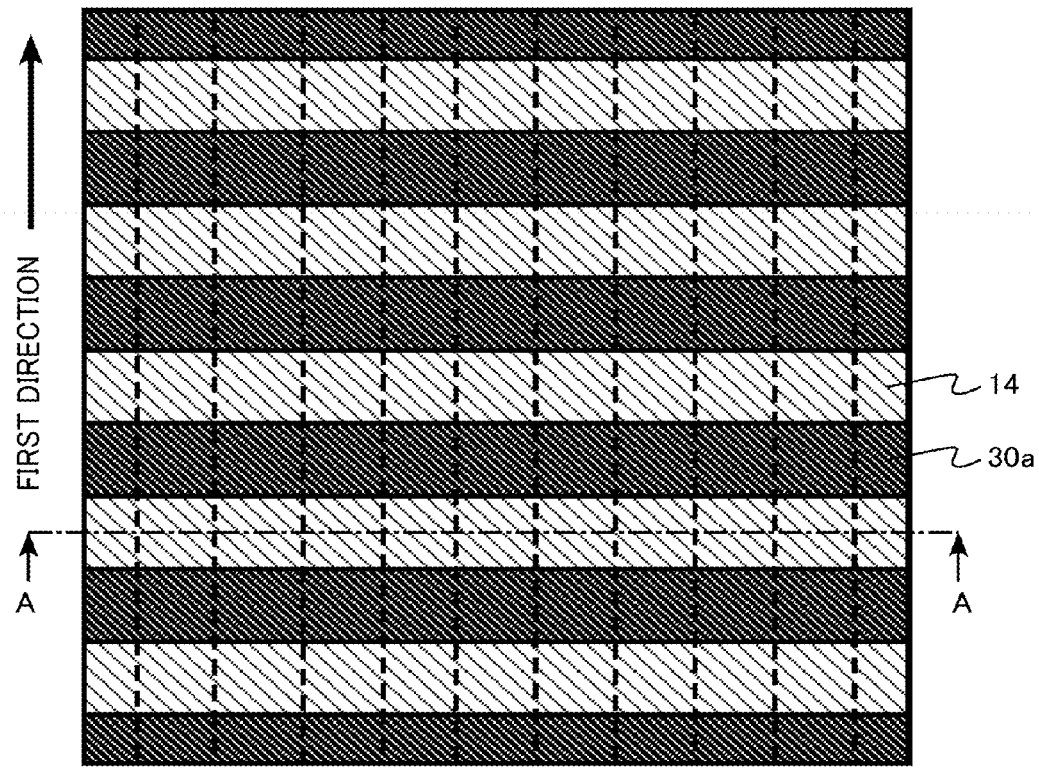
FIGS. 1A and 1B are schematic views of a memory device manufactured by a manufacturing method of a first embodiment.
Figure 1B:
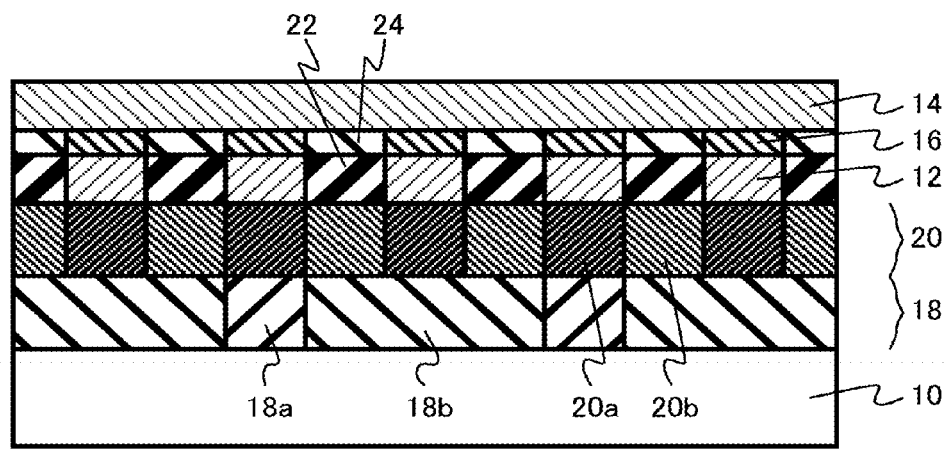

FIGS. 1A and 1B are schematic views of a memory device manufactured by a manufacturing method of the present embodiment. FIG. 1A is a top view, and FIG. 1B is an A-A sectional view of FIG. 1A. Further, FIG. 2 is a schematic perspective view of a memory cell in the memory device of the present embodiment.

The memory device of the present embodiment is a cross-point type organic molecular memory. The memory device is provided with a plurality of first metal wiring layers 12, a plurality of second metal wiring layers 14, and a plurality of memory layers 16 on a substrate 10. The plurality of first metal wiring layers 12, the plurality of second metal wiring layers 14 and the plurality of memory layers 16 constitute a memory cell array of the memory device. The memory cell array is configured of a plurality of memory cells.

The first metal wiring layer 12 extends in a first direction. The second metal wiring layer 14 extends in a second direction intersecting in the first direction. In the present embodiment, the first direction is orthogonal to the second direction.

Figure 2:
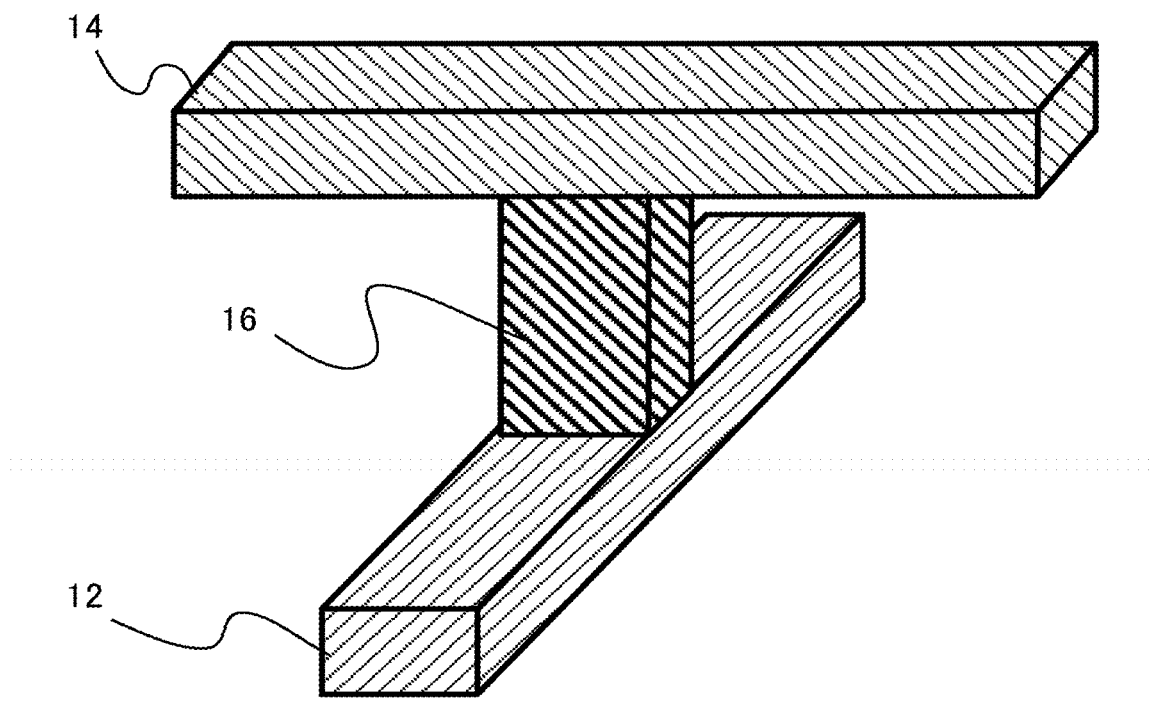
FIG. 2 is a schematic perspective view of a memory cell in the memory device of the first embodiment.

As shown in FIGS. 1A, 1B and 2, the memory layer 16 is provided between the first metal wiring layer 12 and the second metal wiring layer 14 in an intersection between the first metal wiring layer 12 and the second metal wiring layer 14. The memory layer 16 is provided with a function of changing resistance by application of a voltage.

A material for the substrate 10 is not particularly restricted. A semiconductor, an insulating material or the like can be applied. The substrate 10 is, for example, a circuit board with transistors, or a semiconductor substrate of single crystal silicon or amorphous silicon.

A material for the first metal wiring layer 12 and the second metal wiring layer 14 is not particularly restricted. It is desirably a metal formable by atomic layer deposition (ALD) or electroless plating. The material for the first metal wiring layer 12 and the second metal wiring layer 14 is, for example, tungsten (W), nickel (Ni), molybdenum (Mo), gold (au), silver (Ag), copper (Cu), or the like.

A design rule for the first metal wiring layer 12 and the second metal wiring layer 14 is, for example, 5 nm or more and 30 nm or less.

The memory layer 16 is, for example, an organic molecular layer containing organic molecules having resistance change type molecular chains selectively chemically bonded to the first metal wiring layer 12. A film thickness of the memory layer 16 is, for example, 2 nm or more and 20 nm or less. The memory layer 16 is, for example, a monomolecular film of organic molecules.

Figure 3:
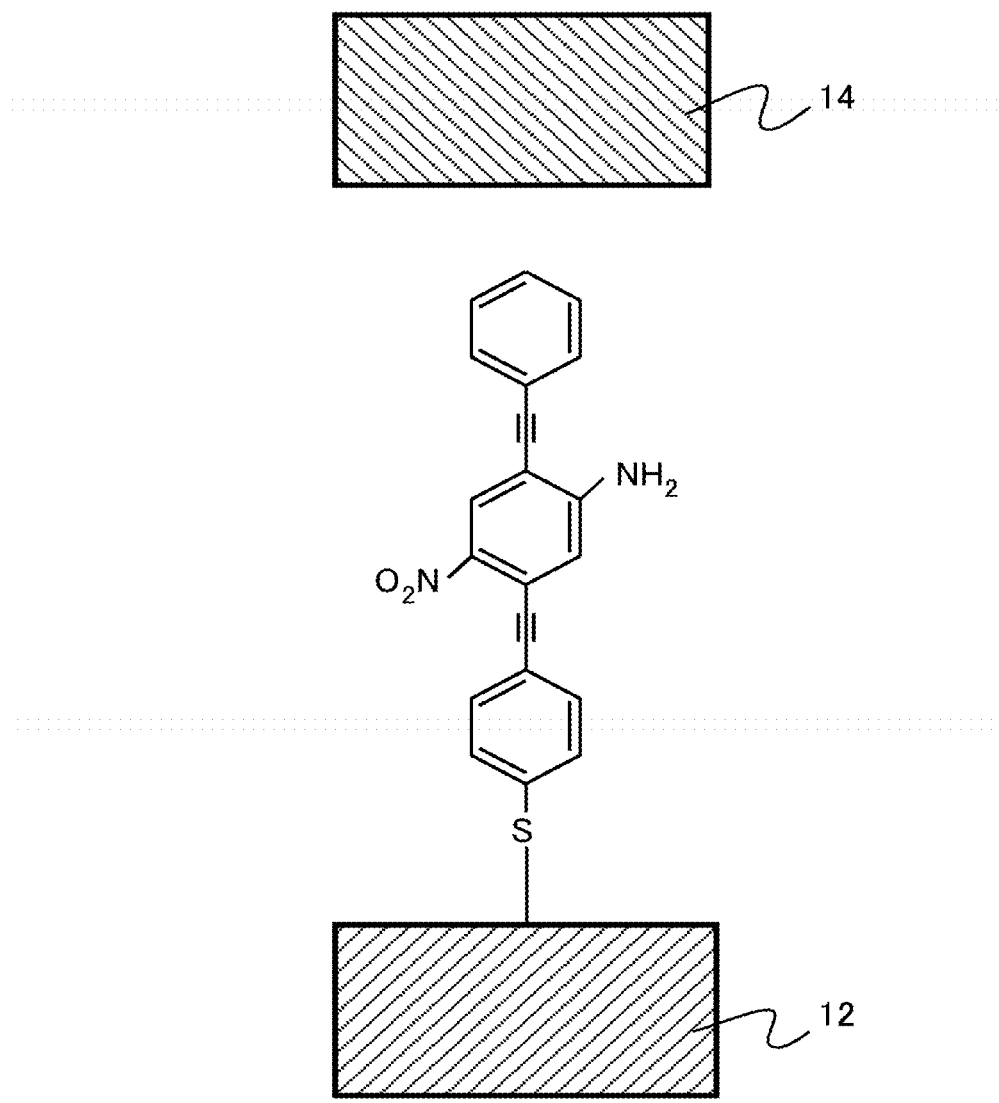
FIG. 3 is a view showing one example of a molecular structure of an organic molecule in a memory layer of the first embodiment.

FIG. 3 is a view showing one example of a molecular structure of the organic molecule in the memory layer of the present embodiment. As shown in FIG. 3, the organic molecular layer of the present embodiment is made up of the organic molecules containing the resistance change type molecular chains. One end of the resistance change type molecular chain is chemically bonded to the first metal wiring layer 12.

The resistance change type molecular chain is a derivative of 4-[2-nitro-5-amino-4-(phenylethynyl)phenylethynyl]benzenethiol. The resistance change type molecular chain of the molecular structure shown in FIG. 3 is also called Tour wire. In the resistance change type molecular chain, a thiol group exists at one end as a linker, and a sulfur atom (S) is chemically bonded with the surface of the first metal wiring layer 12. Here, the linker means a portion for fixing a molecule to an electrode or the like through chemical bonding.

The resistance change type molecular chain is a molecular chain provided with a function of changing resistance due to the existence or non-existence of an electric field or insertion of an electric charge. For example, the resistance change type molecular chain provided with the molecular structure shown in FIG. 3 can switch a low resistance state and a high resistance state by application of a voltage between both ends thereof. The memory cell is realized by using this change in resistance state.

It should be noted that in the memory layer 16, a resistance value desirably changes by one digit or more by application of a voltage from a viewpoint of realizing stable memory characteristics.

As shown in FIG. 1, a first guide layer (guide layer) 18 and a block copolymer layer 20 are provided between the substrate 10 and the first metal wiring layer 12. The first guide layer 18 has a structure where a first region 18a extending in the first direction and a second region 18b having lower surface energy than that of the first region 18a and extending in the first direction are alternately arrayed. Further, a first block copolymer layer (block copolymer layer) 20 is separated into a first phase 20a and a second phase 20b. The first phase 20a contains a first polymer, and the second phase 20b contains a second polymer. The second polymer has lower surface energy than that of the first polymer.

A first insulating film 22 is provided between the first metal wiring layers 12. Further, a second insulating film 24 is provided between the memory layers 16.

Hereinafter, there will be described a method for manufacturing the memory device of the present embodiment. FIGS. 4A to 16A and FIGS. 4B to 16B are schematic views showing the memory device in the middle of manufacturing in the method for manufacturing the memory device of the present embodiment. FIGS. 4A to 16A are top views, and FIGS. 4B to 16B are A-A sectional views of FIGS. 4A to 16A.

Figure 4A:
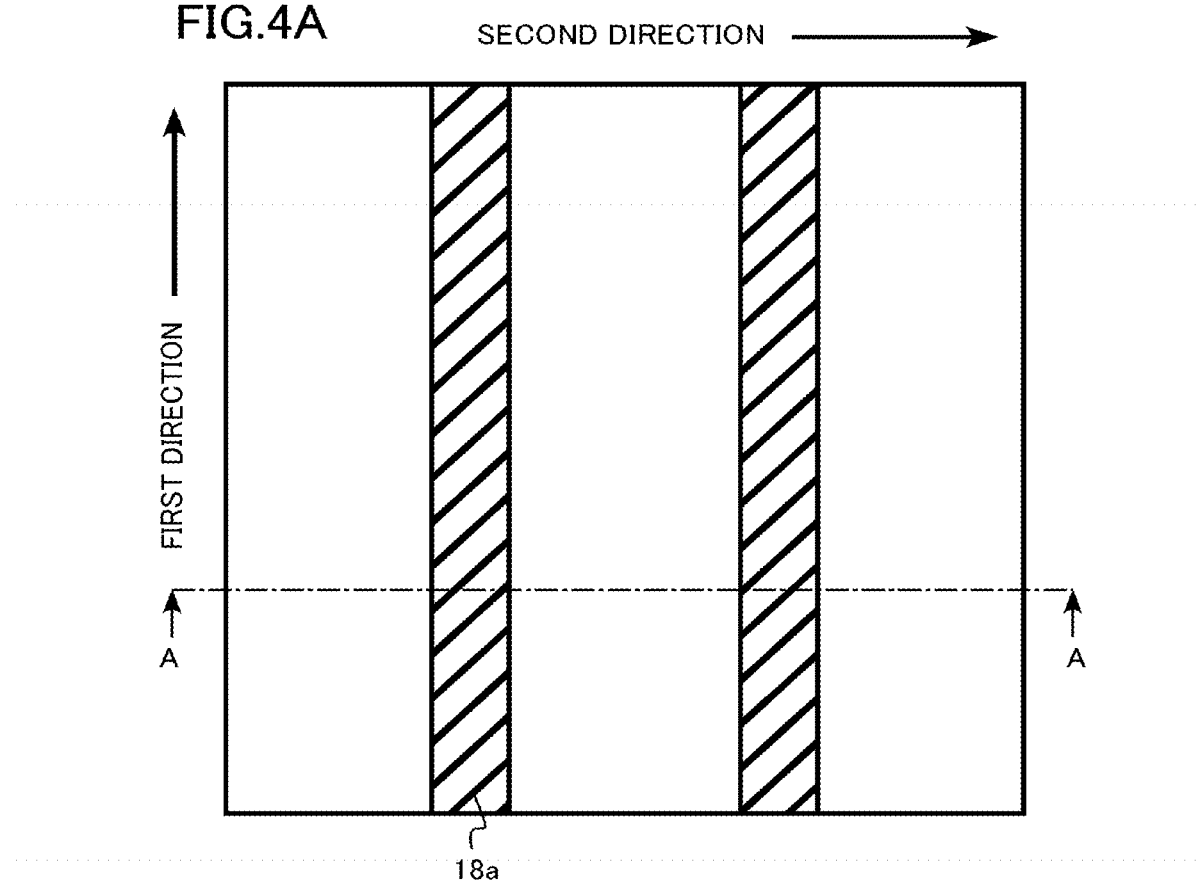
FIGS. 4A and 4B are schematic views showing a memory device in the middle of manufacturing in the method for manufacturing the memory device of the first embodiment.
Figure 4B:
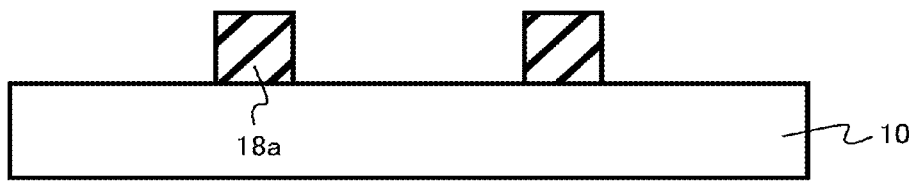

First, a plurality of first regions 18a extending in the first direction is formed on the substrate 10 (FIGS. 4A, 4B). The first region 18a is formed, for example, by application of an organic material film by means of spin-coating, photo lithography, and RIE (reactive ion etching). The substrate 10 is a semiconductor substrate, and for example, a single crystal silicon substrate. The first region 18a is, for example, PHS or P2VP.

Figure 5A:
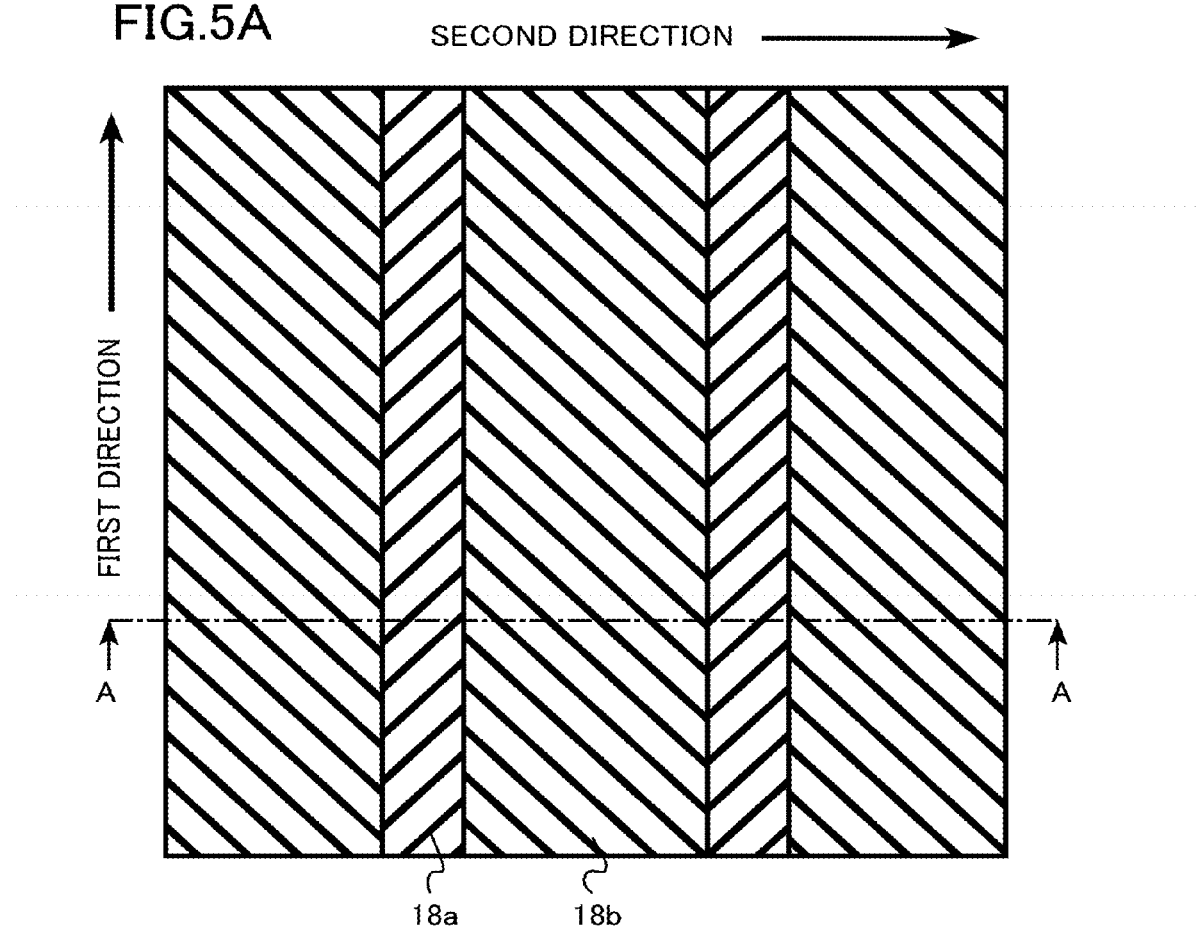
FIGS. 5A and 5B are schematic views showing the memory device in the middle of manufacturing in the method for manufacturing the memory device of the first embodiment.
Figure 5B:
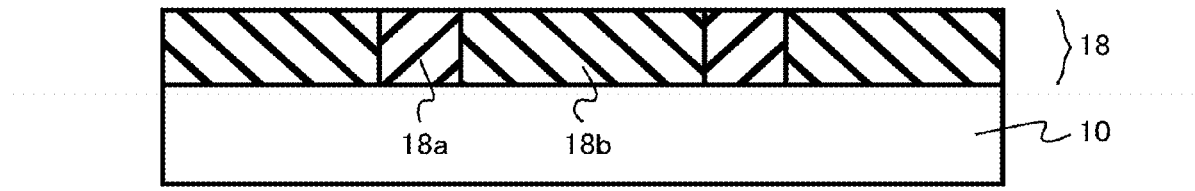

Next, the second region 18b extending in the first direction is formed on the surface of the substrate 10 exposed between the first regions 18a (FIGS. 5A, 5B). The second region 18b is provided with lower surface energy than that of the first region 18a. In other words, the first region 18a has a higher hydrophilic degree than that of the second region 18b. Strictly speaking, the second region 18b has a surface energy value being almost intermediate between those of the first polymer and the second polymer of the block copolymer layer 20 that will be formed later.

The second region 18b is formed, for example, by application of a coating-type organic material film by spin-coating, and elimination of an excess portion. The second region 18b is, for example, PHS-r-PMMA or PS-r-P2VP.

The alternately arrayed first regions 18a and second regions 18b constitute the first guide layer 18. The first region 18a with relatively high surface energy and the second region 18b with relatively low surface energy are alternately arrayed on the surface of the guide layer 18.

It should be noted that the first guide layer 18 can be formed with the surface thereof reformed by changing the first guide layer 18 to an organic material film having a photosensitive resin and, for example, by irradiating a region corresponding to the first region 18a or the second region 18b with light by lithography. The irradiation with light enables formation of the structure where the first region 18a with relatively high surface energy and the second region 18b with relatively low surface energy can be alternately arrayed.

Figure 6A:
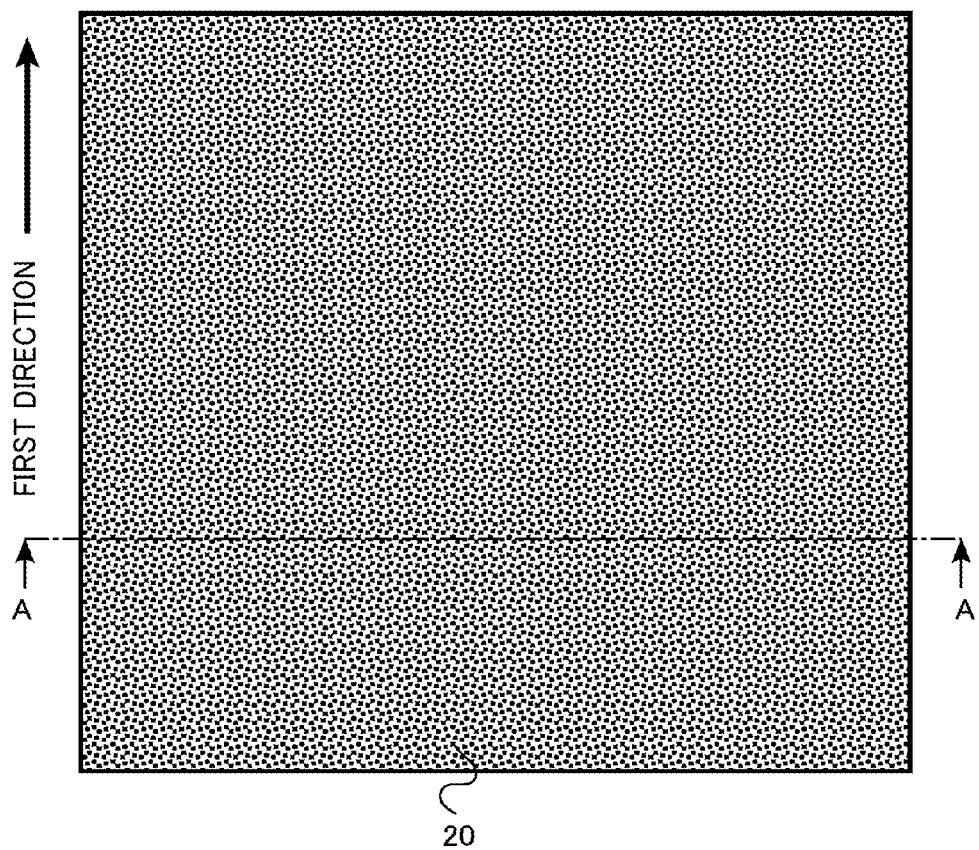
FIGS. 6A and 6B are schematic views showing the memory device in the middle of manufacturing in the method for manufacturing the memory device of the first embodiment.
Figure 6B:
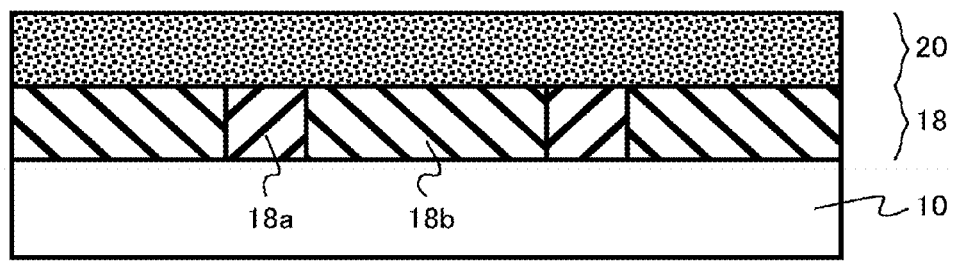

Next, the block copolymer layer 20 is formed on the first guide layer 18 (FIGS. 6A, 6B). The block copolymer layer 20 contains the first polymer and the second polymer having lower surface energy than that of the first polymer. The first polymer has a higher hydrophilic degree than that of the second polymer. The first block copolymer layer 20 is formed, for example, by application by means of spin-coating.

It is desirable that the first polymer contain as a side chain a functional group selected from the group consisting of a pyridine ring, a hydroxyl group, a carboxyl group, an amino group, an amide group and an isocyanate group, and the second polymer not contain the functional group. Further, it is desirable that the first polymer be a polystyrene derivative, and the second polymer be a polymethacrylate derivative.

The first block copolymer layer 20 is, for example, a poly(4-hydroxystyrene)-polymethyl methacrylate block copolymer (PHS-b-PMMA), or a polysthyrene-poly(2-vinylpyridine) block copolymer (PS-b-P2VP). In the former case, the first polymer is PHS, and the second polymer is PMMA. In the latter case, the first polymer is P2VP, and the second polymer is PS.

Figure 7A:
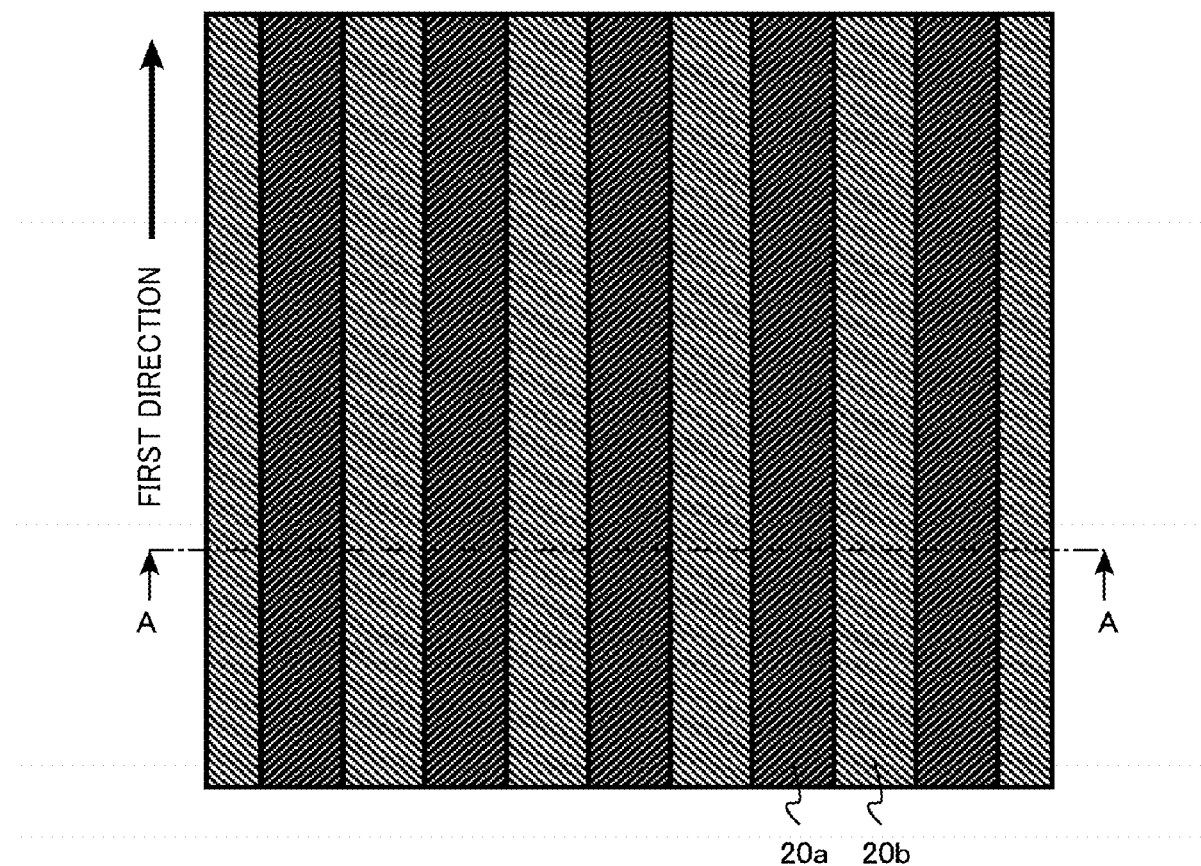
FIGS. 7A and 7B are schematic views showing the memory device in the middle of manufacturing in the method for manufacturing the memory device of the first embodiment.
Figure 7B:
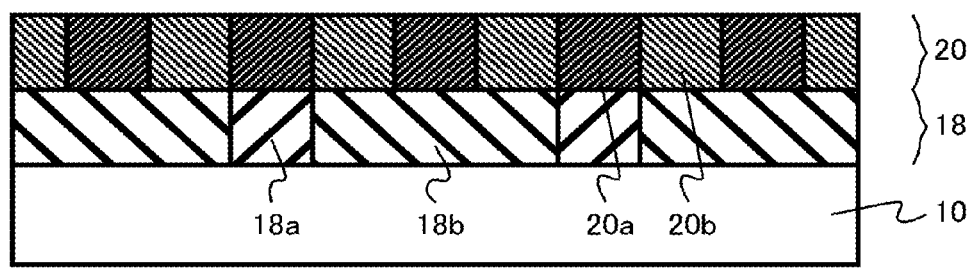

Next, the first block copolymer layer 20 is thermally treated and separated into the first phase 20a and the second phase 20b (FIGS. 7A, 7B). The first phase 20a contains the first polymer and extends in the first direction. The second phase 20b contains the second polymer and extends in the first direction. By the separation, the first phase 20a and the second phase 20b are alternately arrayed.

In addition, from a viewpoint of stably separating the first phase 20a and the second phase 20b, it is desirable that the first polymer have larger surface energy than that of the second region 18b and the second polymer have smaller surface energy than that of the second region 18b. Further, from the viewpoint of stably separating the first phase 20a and the second phase 20b, it is more desirable that the first region 18a have surface energy close to that of the first polymer and the second region 18b have surface energy being almost intermediate between those of the first polymer and the second polymer. Then, from the viewpoint of stably separating the first phase 20a and the second phase 20b, it is further desirable that the first region 18a have almost the same surface energy as that of the first polymer.

Figure 8A:
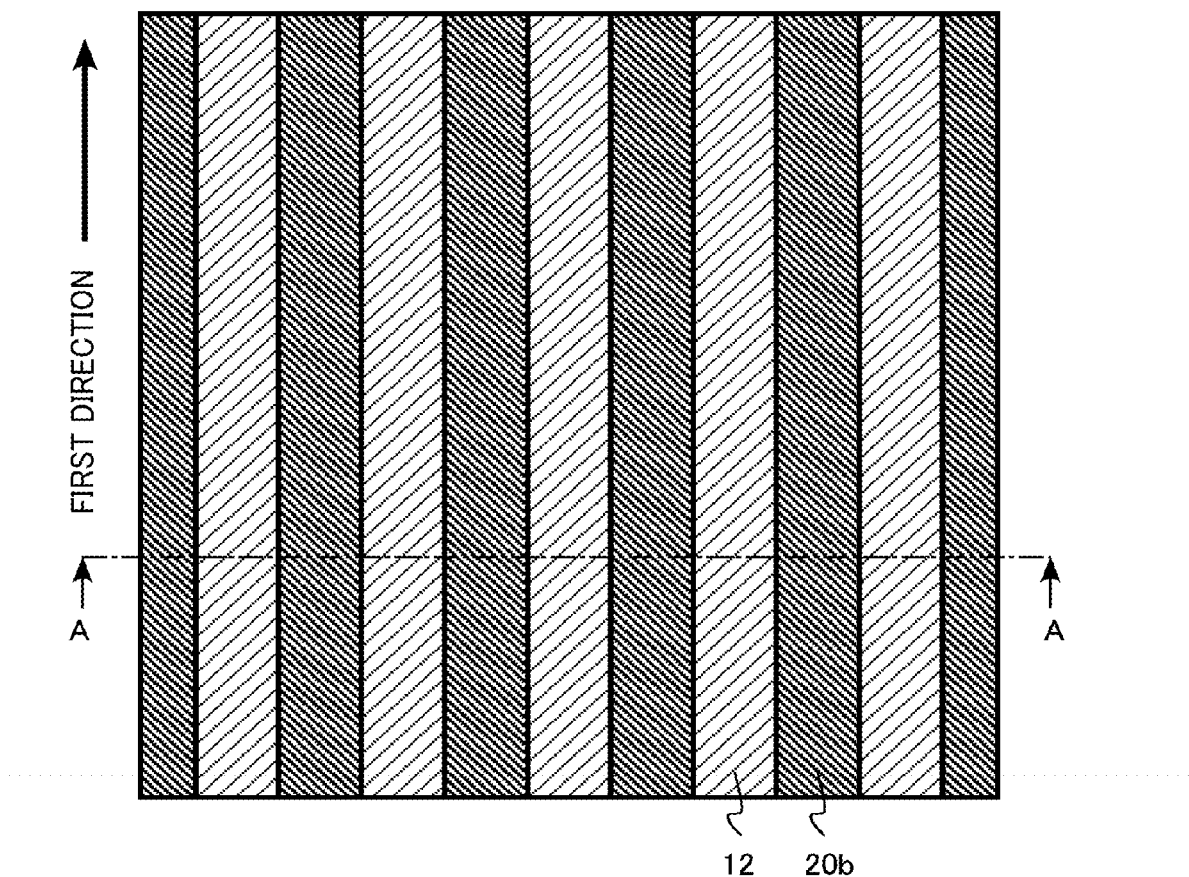
FIGS. 8A and 8B are schematic views showing the memory device in the middle of manufacturing in the method for manufacturing the memory device of the first embodiment.
Figure 8B:
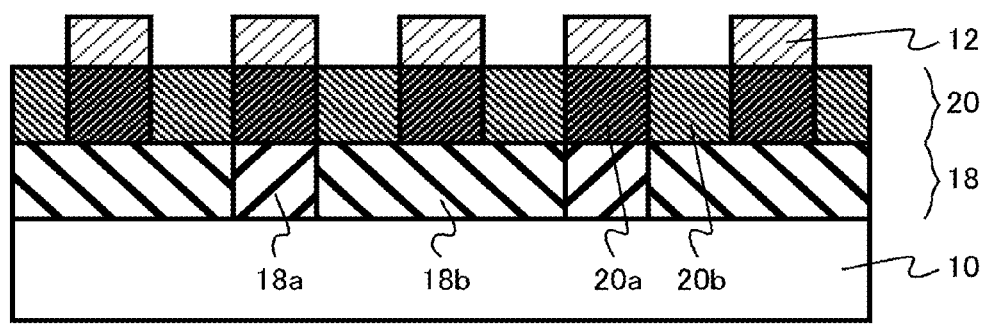

Next, the first metal wiring layer 12 extending in the first direction is selectively formed on the surface of the first phase 20a (FIGS. 8A, 8B). The first metal wiring layer 12 is selectively formed on the surface of the first phase 20a with high surface energy as compared with that of the second phase 20b.

The first metal wiring layer 12 is formed, for example, by atomic layer deposition or electroless plating. The material for the first metal wiring layer 12 is, for example, tungsten (W), molybdenum (Mo), gold (au), silver (Ag), copper (Cu), or the like.

Before the first metal wiring layer 12 is formed, a metal oxide film having a film thickness of 1 nm or less can be formed on the surface of the first phase 20a. The formation of the metal oxide film facilitates selective growth of the first metal wiring layer 12 on the first phase 20a. The metal oxide film is, for example, a hafnium oxide film, an aluminum oxide film, or the like.

When the film thickness of the metal oxide film exceeds the above range, it impedes scaling-down of the memory cell, which is not desirable. It should be noted that the film thickness of the metal oxide film can be measured, for example, by TEM (transmission electron microscope).

Figure 9A:
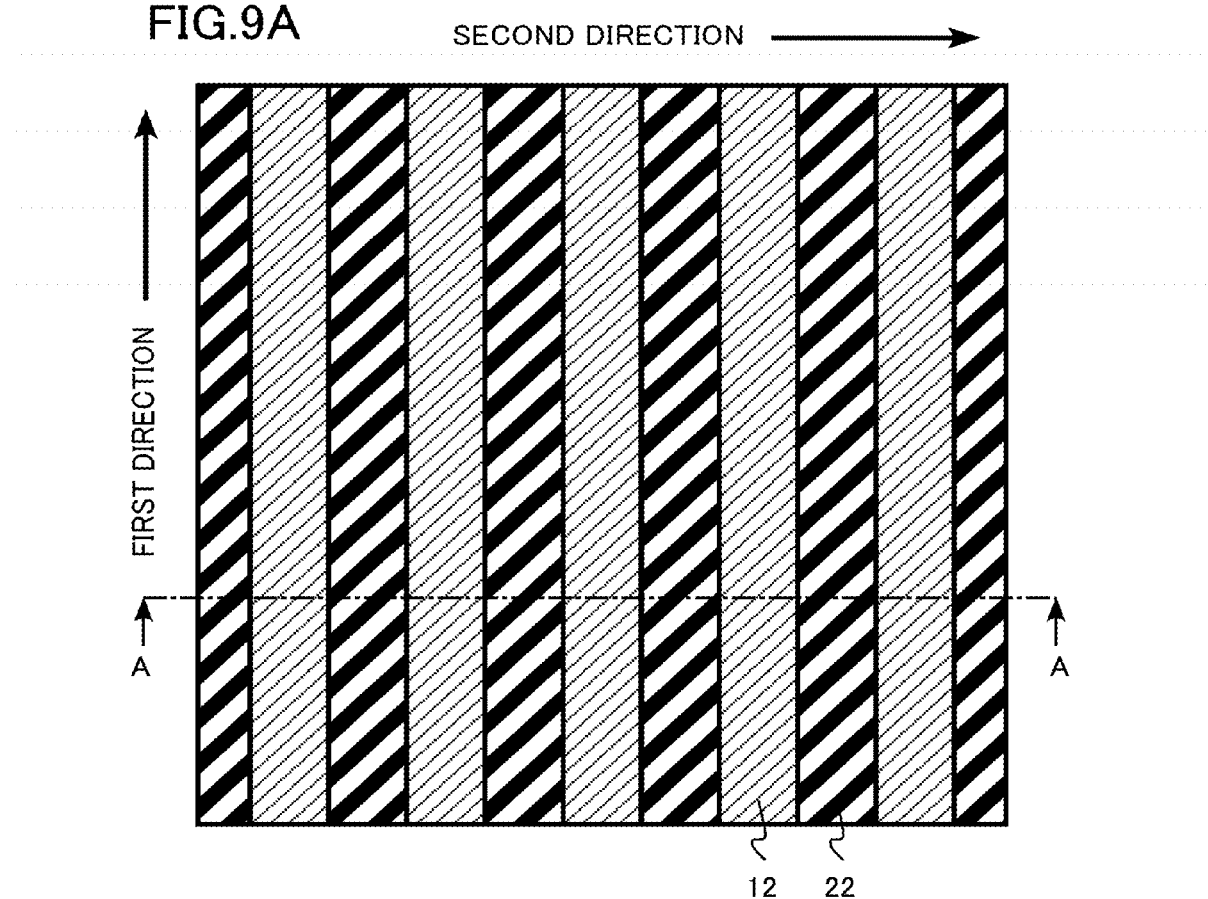
FIGS. 9A and 9B are schematic views showing the memory device in the middle of manufacturing in the method for manufacturing the memory device of the first embodiment.
Figure 9B:
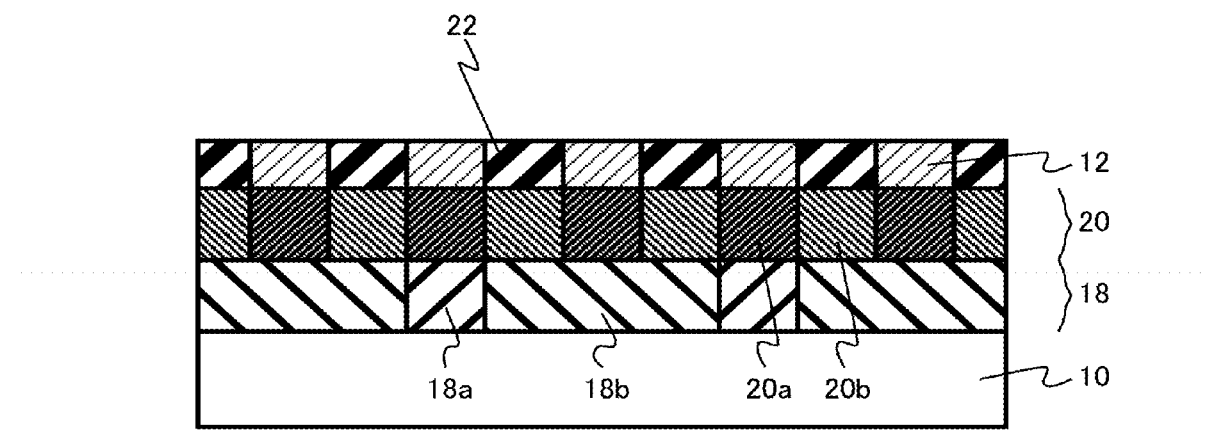

Next, the first insulating film 22 is formed between the first metal wiring layers 12 (FIGS. 9A, 9B). The first insulating film 22 is formed, for example, by deposition of the insulating film by means of CVD (Chemical Vapor Deposition), and polishing by means of CMP (Chemical Mechanical Polishing).

Next, a plurality of third regions 28a extending in the second direction are formed on the first metal wiring layer 12 and the first insulating film 22 (FIGS. 10A, 10B). The third region 28a is formed, for example, by application of an organic material film by means of spin-coating, photo lithography, and RIE. The third region 28a is, for example, PHS, P2VP or PMMA.

Figure 11A:
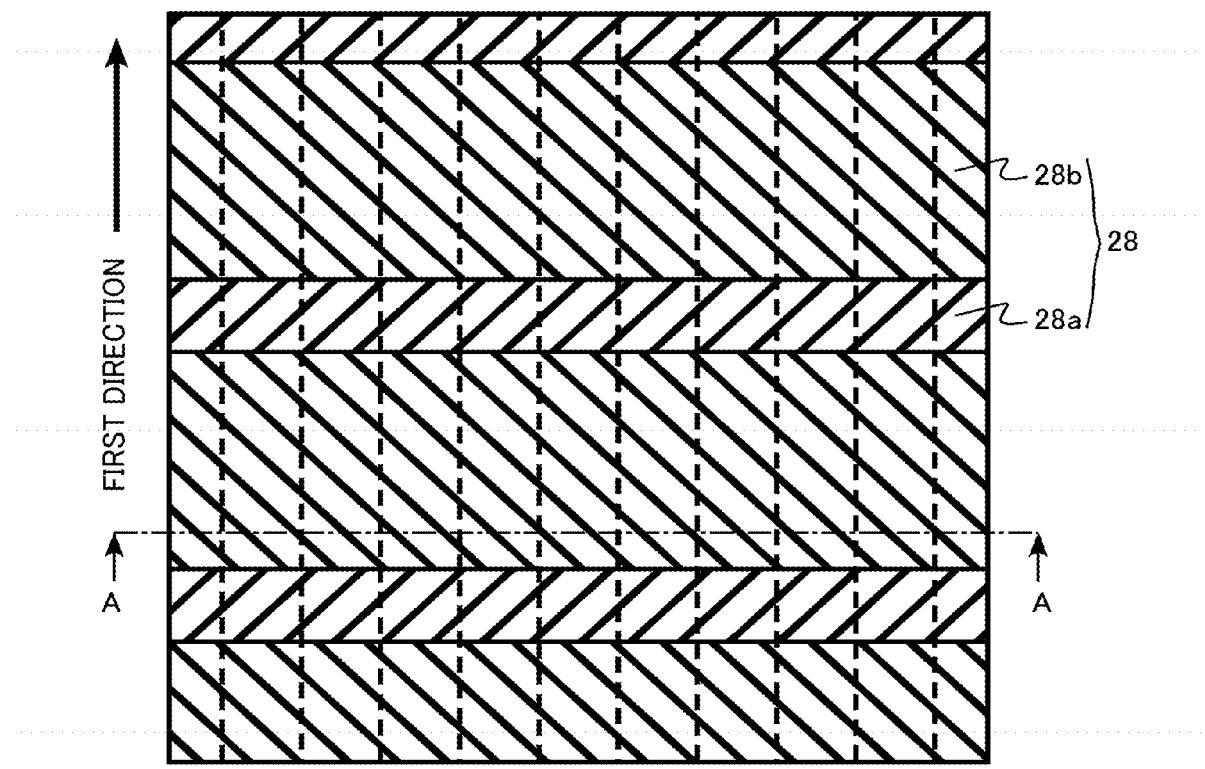
FIGS. 11A and 11B are schematic views showing the memory device in the middle of manufacturing in the method for manufacturing the memory device of the first embodiment.
Figure 11B:
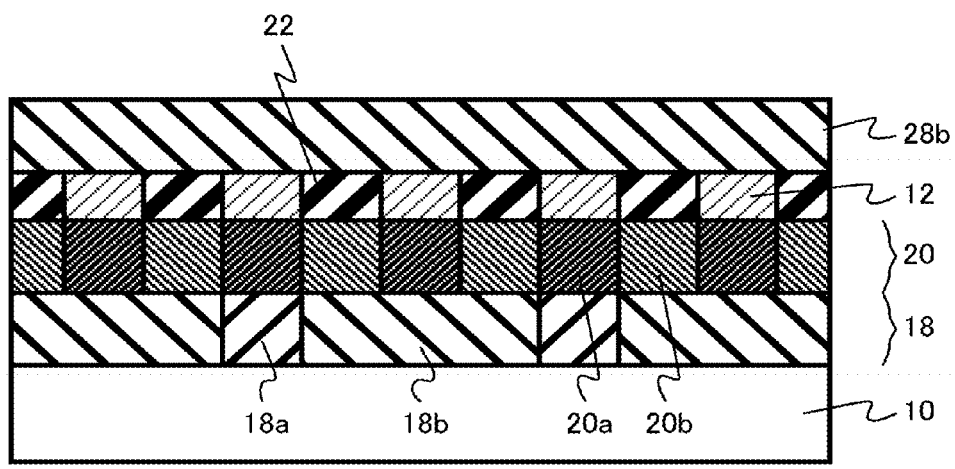

Next, a fourth region 28b extending in the second direction is formed on the surfaces of the first metal wiring layer 12 and the first insulating film 22 exposed between the third regions 28a (FIGS. 11A, 11B). The fourth region 28b is provided with lower surface energy than that of the third region 28a. In other words, the third region 28a has a higher hydrophilic degree than that of the fourth region 28b. Strictly speaking, the third region 28a has a surface energy value being almost intermediate between those of a third polymer and a fourth polymer of the block copolymer layer 30 that will be formed later.

The fourth region 28b is formed, for example, by application of a coating-type organic material film by spin-coating, and elimination of an excess portion. The fourth region 28b is, for example, PHS-r-PMMA, PS-r-P2VP or PS-r-PMMA.

The alternately arrayed third region 28a and fourth region 28b constitute a second guide layer 28. The third region 28a with relatively high surface energy and the fourth region 28b with relatively low surface energy are alternately arrayed on the surface of the second guide layer 28.

Figure 12A:
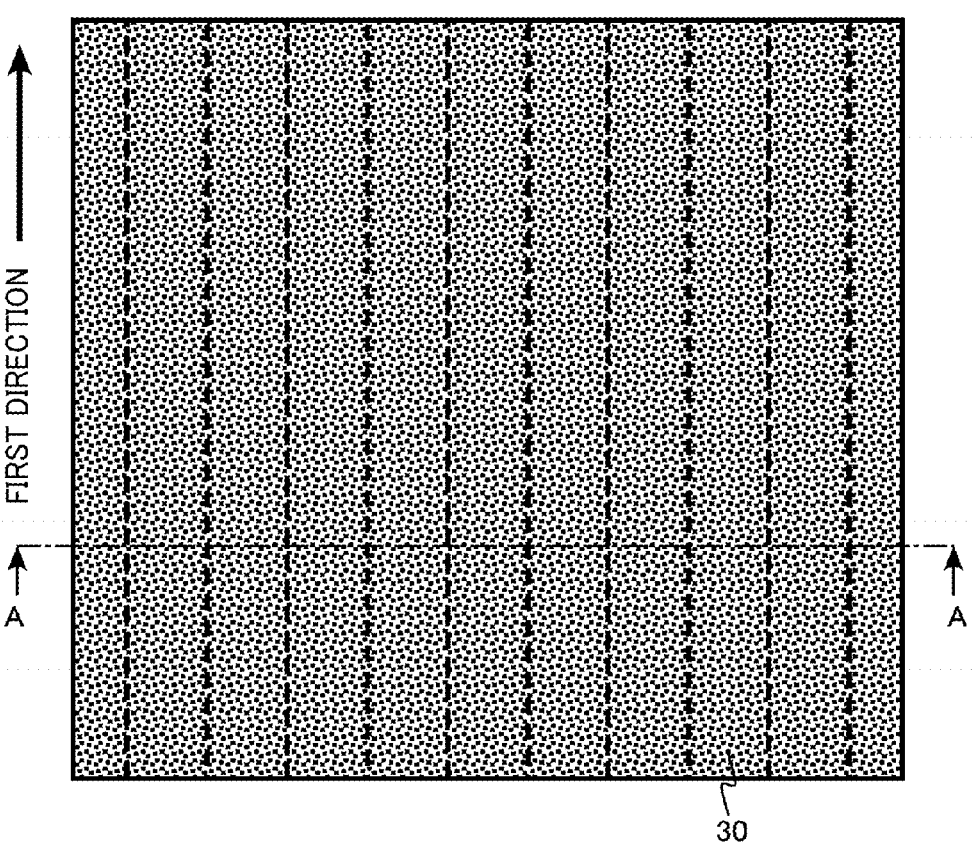
FIGS. 12A and 12B are schematic views showing the memory device in the middle of manufacturing in the method for manufacturing the memory device of the first embodiment.
Figure 12B:
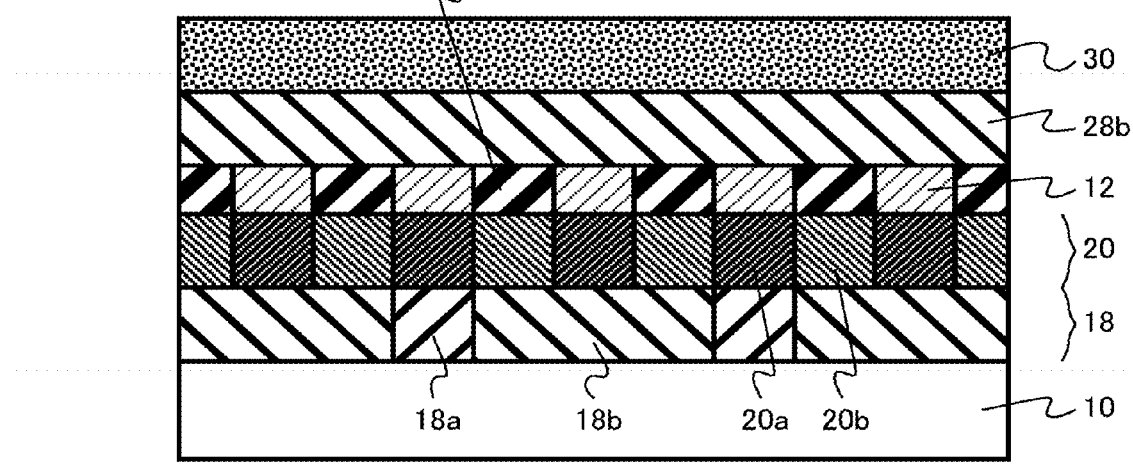

Next, a second block copolymer layer 30 is formed on the second guide layer 28 (FIGS. 12A, 12B). The second block copolymer layer 30 contains the third polymer and the fourth polymer having lower surface energy than that of the third polymer. The third polymer has a higher hydrophilic degree than that of the fourth polymer. The second block copolymer layer 30 is formed, for example, by application by means of spin-coating.

The second block copolymer layer 30 is, for example, a poly(4-hydroxystyrene)-polymethyl methacrylate block copolymer (PHS-b-PMMA), a polysthyrene-poly(2-vinylpyridine) block copolymer (PS-b-P2VP), or a polysthyrene-polymethyl methacrylate block copolymer (PS-b-PMMA). In this case, the third polymer is PHS, P2VP or PMMA, and the fourth polymer is PMMA or polysthyrene.

Figure 13A:
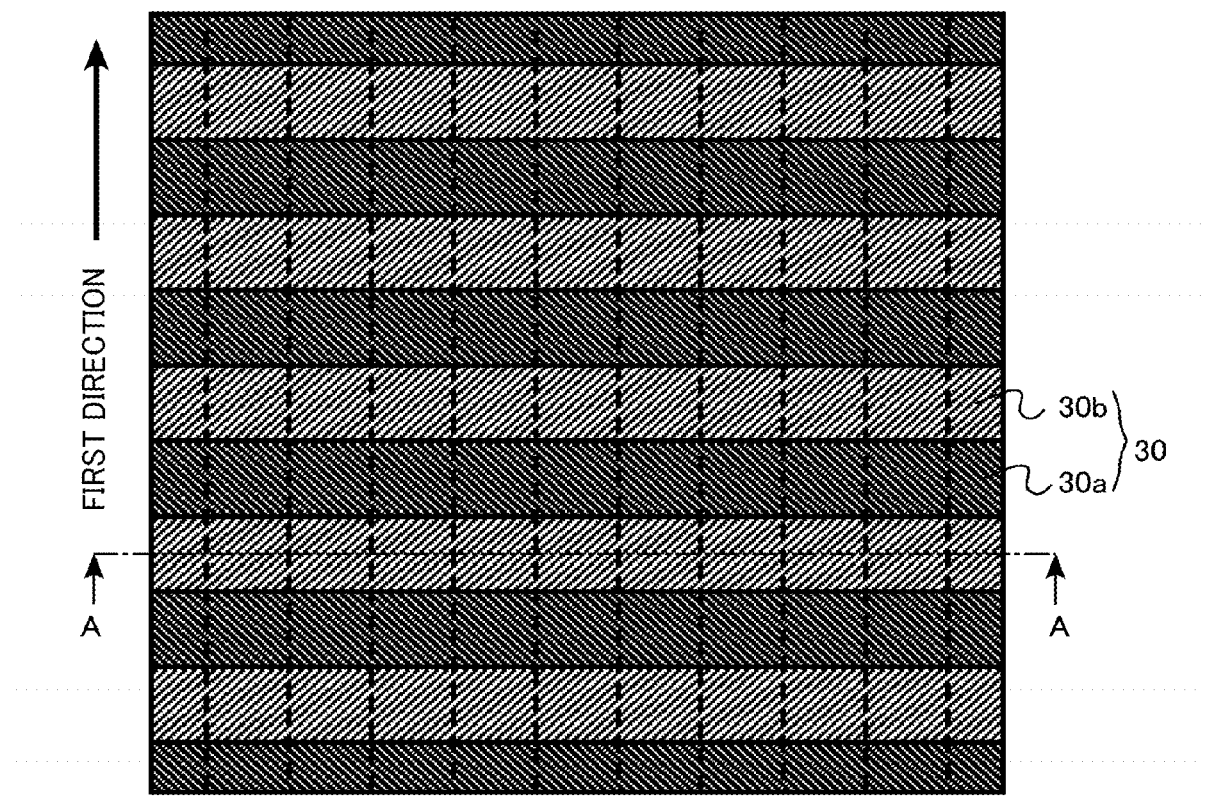
FIGS. 13A and 13B are schematic views showing the memory device in the middle of manufacturing in the method for manufacturing the memory device of the first embodiment.
Figure 13B:
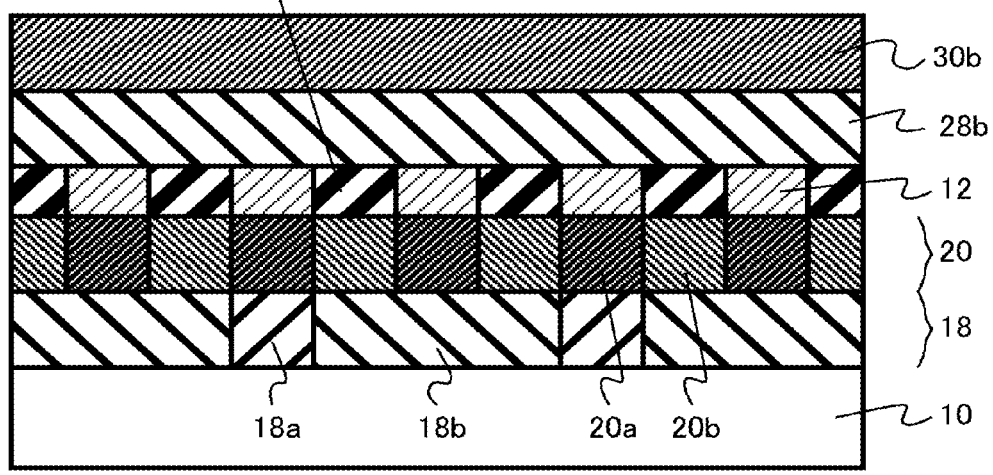

Next, the second block copolymer layer 30 is thermally treated and separated into a third phase 30a and a fourth phase 30b (FIGS. 13A, 13B). The third phase 30a contains the third polymer and extends in the second direction. The fourth phase 30b contains the fourth polymer and extends in the second direction. By the separation, the third phase 30a and the fourth phase 30b are alternately arrayed.

Figure 14A:
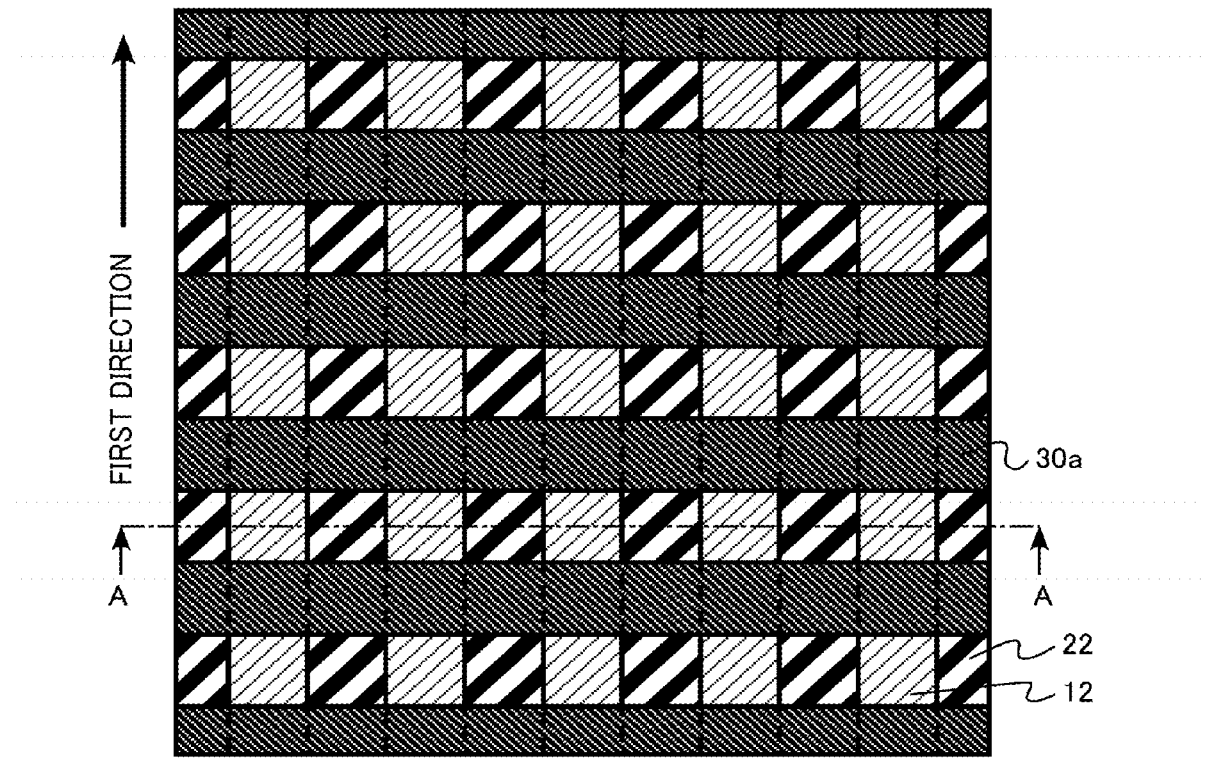
FIGS. 14A and 14B are schematic views showing the memory device in the middle of manufacturing in the method for manufacturing the memory device of the first embodiment.
Figure 14B:
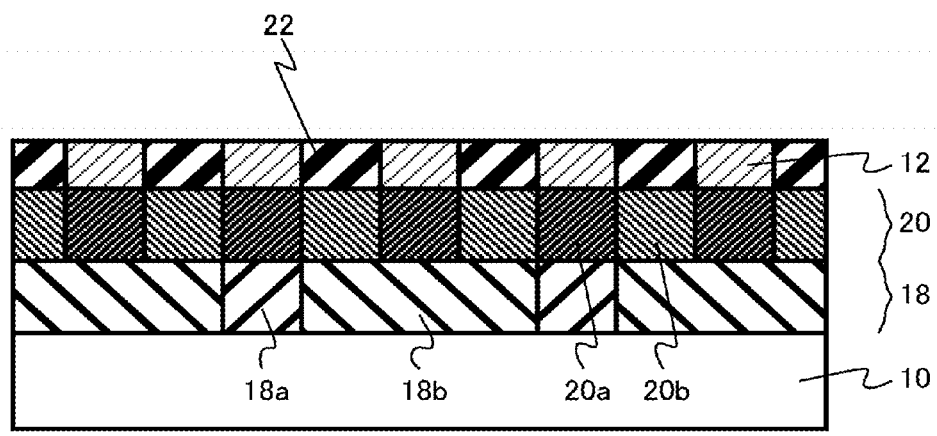

Next, the fourth phase 30b is selectively eliminated with respect to the third phase 30a. Further, the second guide layer 28 as a lower layer of the fourth phase 30b is eliminated such that the surfaces of the first metal wiring layer 12 and the insulating film 22 as lower layers of the second guide layer 28 are exposed (FIGS. 14A, 14B). The fourth phase 30b and the second guide layer 28 are etched and eliminated by RIE by use of a fluorine-based or oxygen-based gas.

Figure 15A:
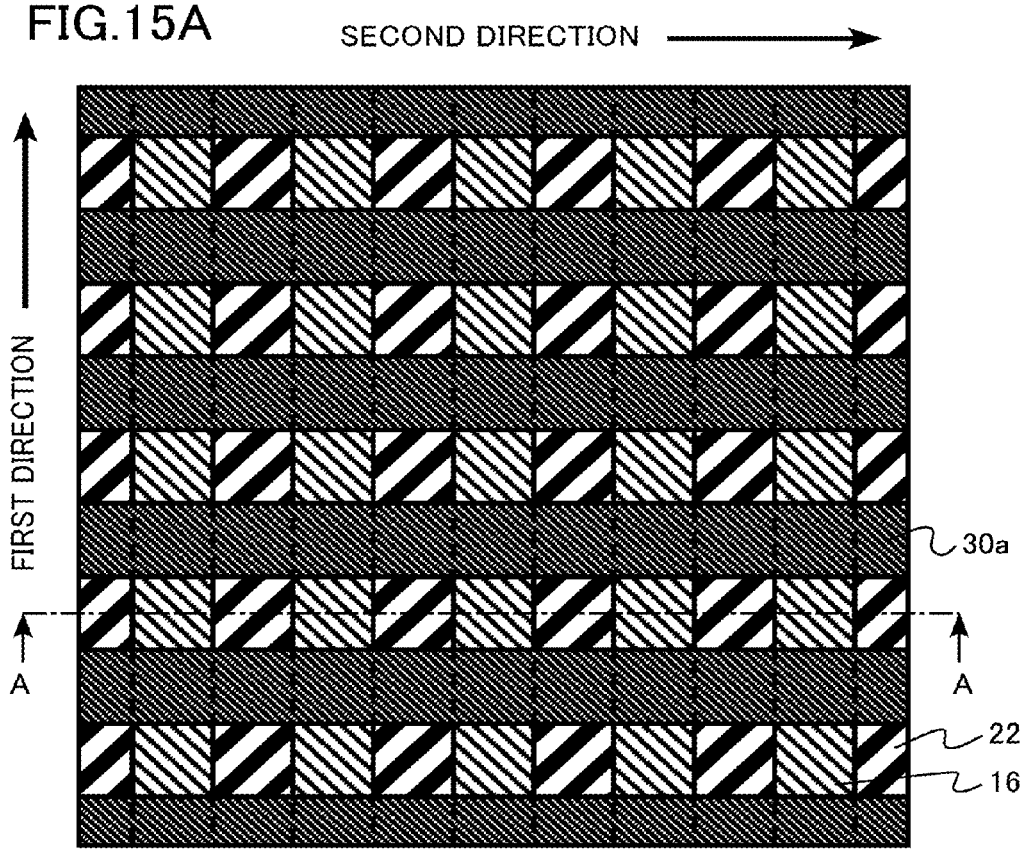
FIGS. 15A and 15B are schematic views showing the memory device in the middle of manufacturing in the method for manufacturing the memory device of the first embodiment.
Figure 15B:
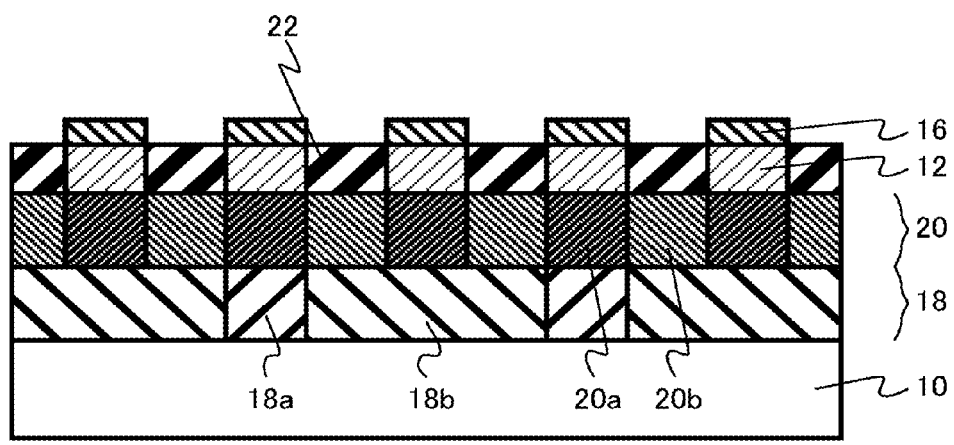

Next, the memory layer 16 where resistance changes by application of a voltage is formed on the first metal wiring layer 12 (FIGS. 15A, 15B). The memory layer 16 is an organic molecular layer containing organic molecules having resistance change type molecular chains selectively chemically bonded with the first metal wiring layer 12. The memory layer 16 is selectively formed on the first metal wiring layer 12 by immersing the first metal wiring layer 12 in an organic molecule solution, for example. The organic molecular layer is, for example, an SAM (Self Aligned Monolayer).

It should be noted that a metal oxide layer may be formed on the first metal wiring layer 12 by atomic layer deposition after formation of the first metal wiring layer 12 and before formation of the memory layer 16. Forming the metal oxide layer allows adjustment of a resistance value of the memory layer 16 and the stability of resistance thereof.

Figure 16A:
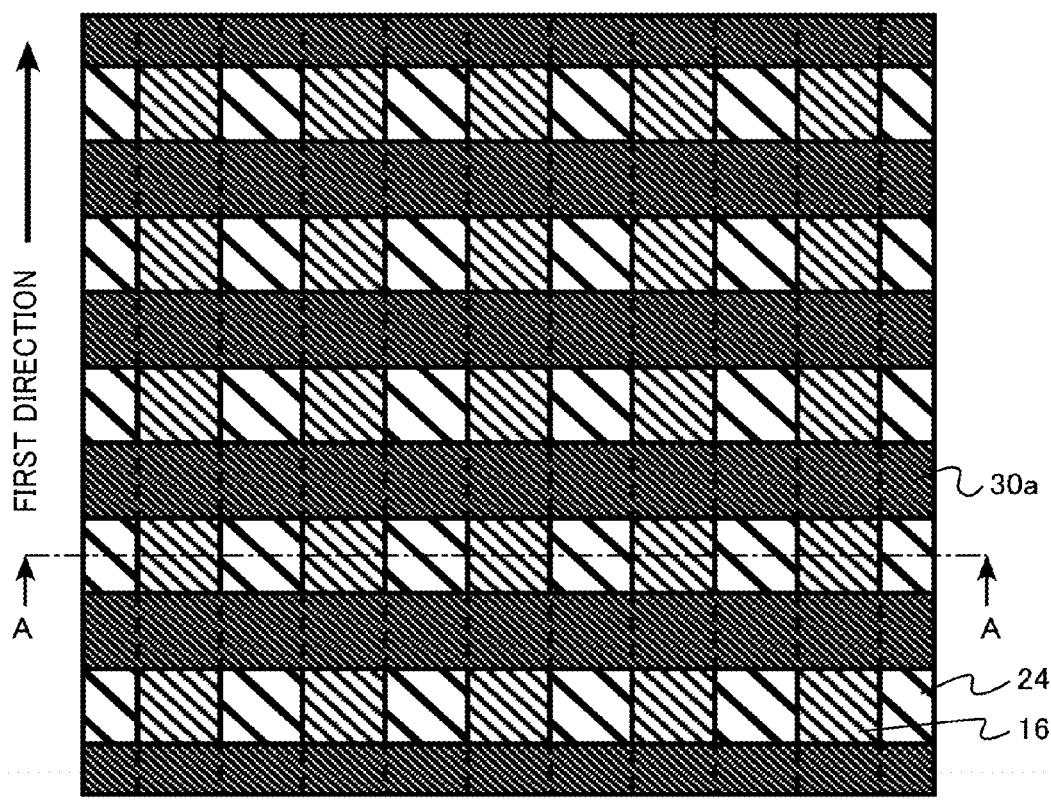
FIGS. 16A and 16B are schematic views showing the memory device in the middle of manufacturing in the method for manufacturing the memory device of the first embodiment.
Figure 16B:
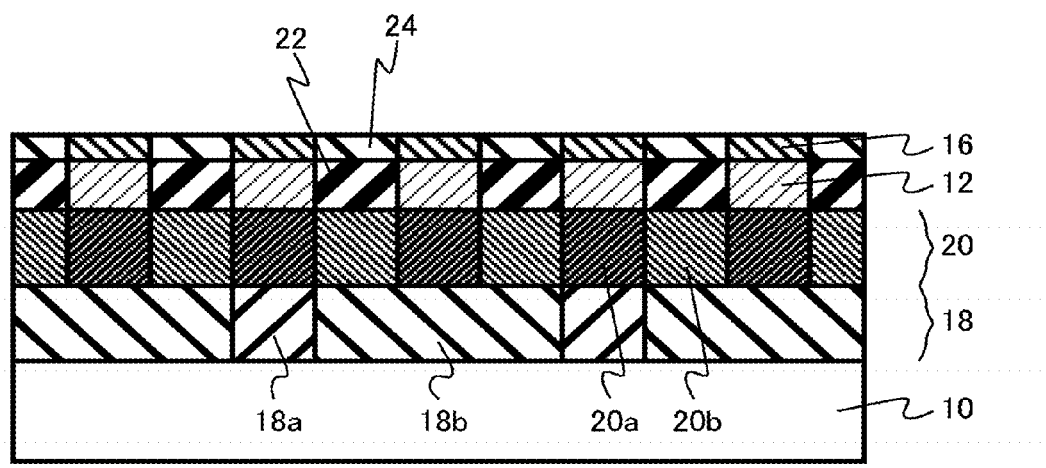

Next, the second insulating film 24 is selectively formed on the first insulating film 22 (FIGS. 16A, 16B). The second insulating film 24 is, for example, an organic molecular layer containing organic molecules selectively chemically bonded to the first insulating film 22. The second insulating film 24 is selectively formed on the first insulating film 22 by immersing the first insulating film 22 in an organic molecule solution, for example. The organic molecule is, for example, an organic molecule containing an alkyl chain.

Thereafter, the second metal wiring layer 14 is selectively formed on the memory layer 16 and the second insulating film 24 exposed between the third phases 30a. The second metal wiring layer 14 extends in the second direction. The second metal wiring layer 14 is formed, for example, by atomic layer deposition or electroless plating. A material for the second metal wiring layer 14 is, for example, tungsten (W), molybdenum (Mo), gold (au), silver (Ag), copper (Cu), or the like.

It should be noted that a metal oxide layer may be formed on the memory layer 16 by atomic layer deposition after formation of the memory layer 16 and before formation of the second metal wiring layer 14. Forming the metal oxide layer allows adjustment of a resistance value of the memory layer 16 and the stability of resistance thereof.

The memory device shown in FIGS. 1A and 1B are manufactured by the above manufacturing method.

Hereinafter, there will be described a function and an effect of the method for manufacturing the memory device of the present embodiment.

In order to realize low cost of a memory device such as nonvolatile semiconductor memory device, a method for scaling-down a size of a memory cell has prevailed. However, there are increasing technical difficulties in scaling down the memory cell. It is particularly desired to reduce the number of high-cost steps such as high-precision lithography and etching of a metal film.

In the present embodiment, metal wiring of a memory cell array is formed by using a block copolymer as a self-assembling material. That is, first, a line and space pattern with a small design rule is formed by means of phase separation of the block copolymer. Hence it is possible to form a pattern with a small design rule without using high-precision lithography. Further, the first and second metal wiring layers 12, 14 are selectively formed on a pattern formed by means of the phase separation of the block copolymer. Hence it is possible to form the first and second metal wiring layers 12, 14 without using etching of the metal film.

By forming the memory cell array in a bottom-up manner with the block copolymer taken as a starting point, it is possible to reduce the number of complex steps and high-cost steps. This can make the manufacturing process simplified and low-cost. Hence it is possible to manufacture the memory device at low cost.

Further, the memory layer 16 is formed on the first metal wiring layer 12 by a pattern for processing the second metal wiring layer 14. Hence it is possible to form the first metal wiring layer 12, the memory layer 16 and the second metal wiring layer 14 by self-aligning in a cross-point type memory cell array. It is thus possible to realize scaling-down of the memory device.

In the above, according to the present embodiment, it is possible to reduce manufacturing cost of the memory device. It is thus possible to realize scaling-down of the memory device.

Second Embodiment

A method for manufacturing a memory device of the present embodiment is similar to the first embodiment except that a guide layer having a groove extending in the first direction is formed on the substrate before formation of the block copolymer layer and the block copolymer layer is formed in the groove. Hence descriptions of contents overlapping those of the first embodiment will be omitted.

FIGS. 17A to 21A and FIGS. 17B to 21B are schematic views showing the memory device in the middle of manufacturing in the method for manufacturing the memory device of the present embodiment. FIGS. 17A to 21A are top views, and FIGS. 17B to 21B are A-A sectional views of FIGS. 17A to 21A.

First, a groove 37 is formed by a plurality of insulating layers 36 extending in the first direction on the substrate 10 (FIGS. 17A, 17B). These groove 37 and insulating layer 36 serve as the guide layer. The insulating layer 36 is formed, for example, by deposition of the insulating film by means of CVD, photo lithography, and RIE. The substrate 10 is, for example, a single crystal silicon substrate. The insulating layers 36 is, for example, a silicon oxide film.

Figure 18A:
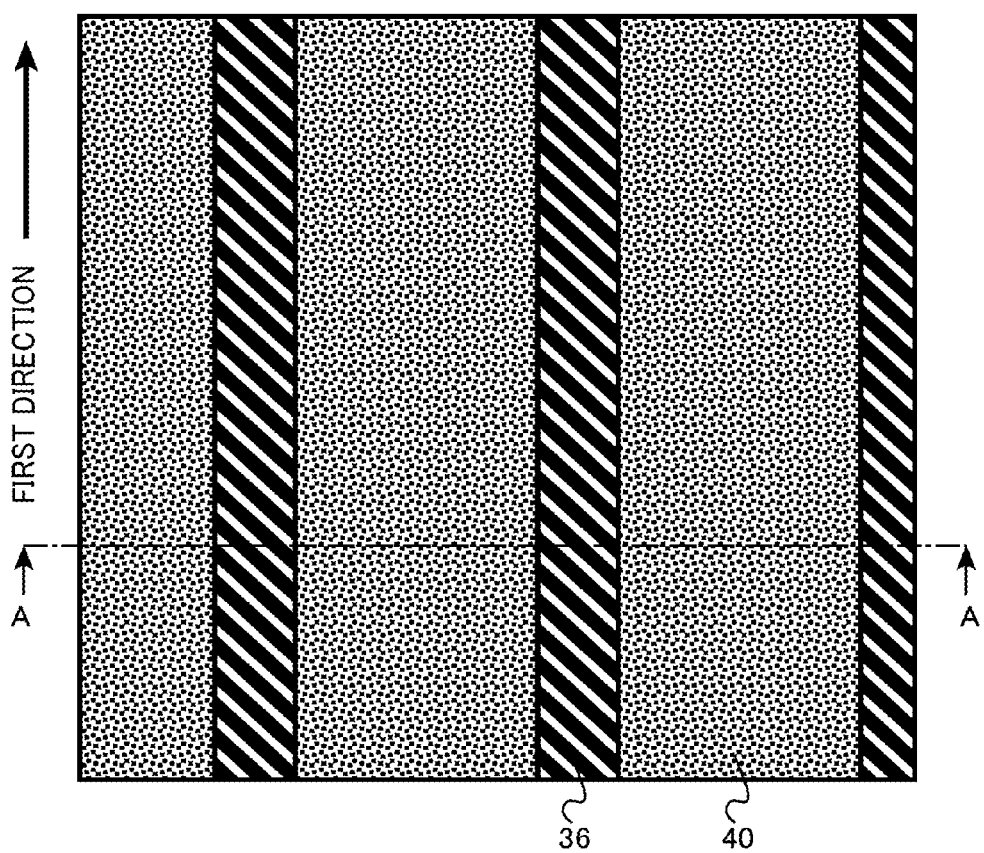
FIGS. 18A and 18B are schematic views showing the memory device in the middle of manufacturing in the method for manufacturing the memory device of the second embodiment.
Figure 18B:
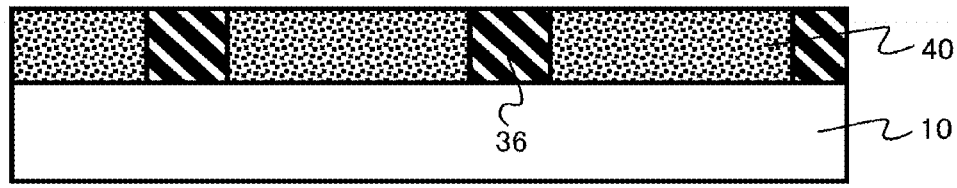

Next, a block copolymer layer 40 is formed in the groove 37 formed between the insulating layers 36 (FIGS. 18A, 18B). The block copolymer layer 40 contains the first polymer and the second polymer having lower surface energy than that of the first polymer. The first polymer has a higher hydrophilic degree than that of the second polymer. The block copolymer layer 40 is formed, for example, by application by means of spin-coating.

Figure 19A:
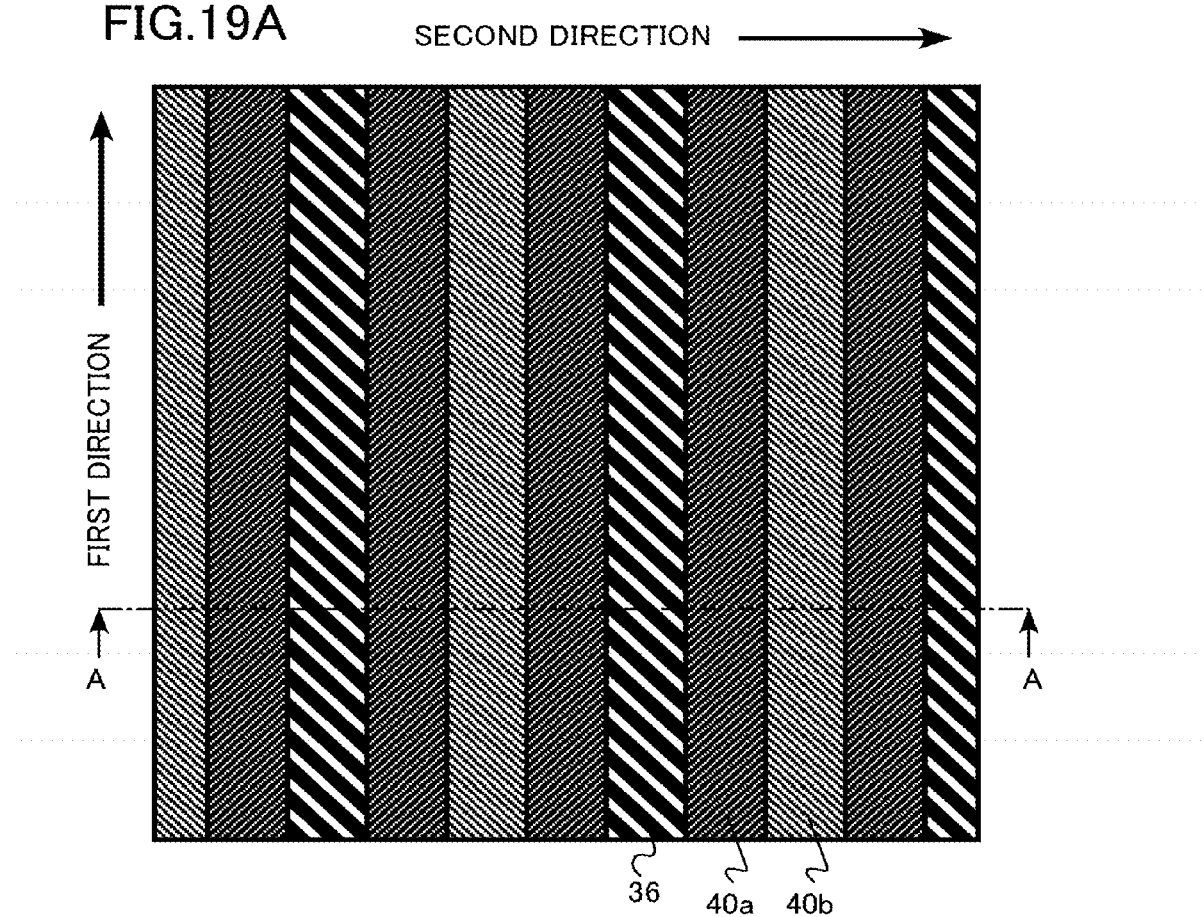
FIGS. 19A and 19B are schematic views showing the memory device in the middle of manufacturing in the method for manufacturing the memory device of the second embodiment.
Figure 19B:
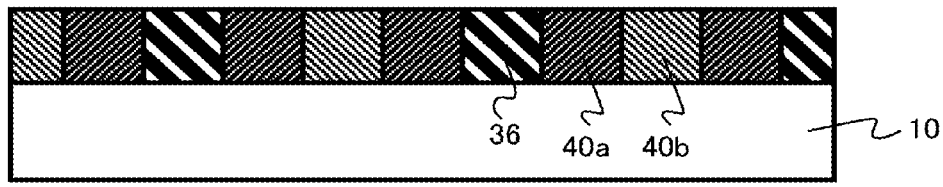

Next, the block copolymer layer 40 is thermally treated and separated into a first phase 40*a* and a second phase 40*b* (FIGS. 19A, 19B). The first phase 40*a* contains the first polymer and extends in the first direction. The second phase 40*b* contains the second polymer and extends in the first direction. By the separation, the first phase 40*a* and the second phase 40*b* are alternately arrayed.

Figure 20A:
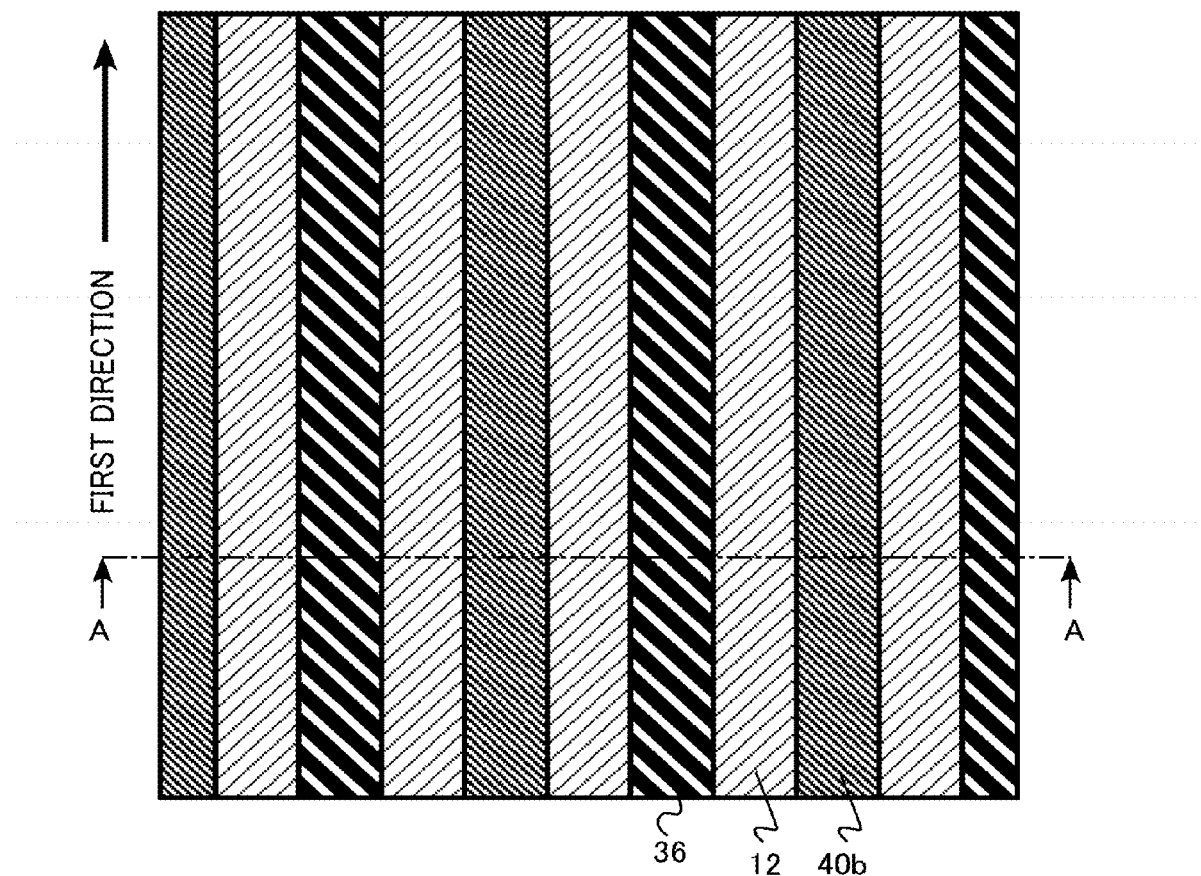
FIGS. 20A and 20B are schematic views showing the memory device in the middle of manufacturing in the method for manufacturing the memory device of the second embodiment.
Figure 20B:
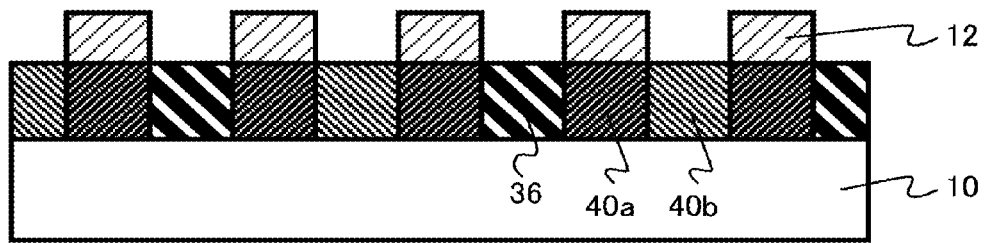

Next, the first metal wiring layer 12 extending in the first direction is selectively formed on the surface of the first phase 40*a* (FIGS. 20A, 20B). The first metal wiring layer 12 is selectively formed on the surface of the first phase 40*a* with high surface energy as compared with that of the second phase 40*b*.

Figure 21A:
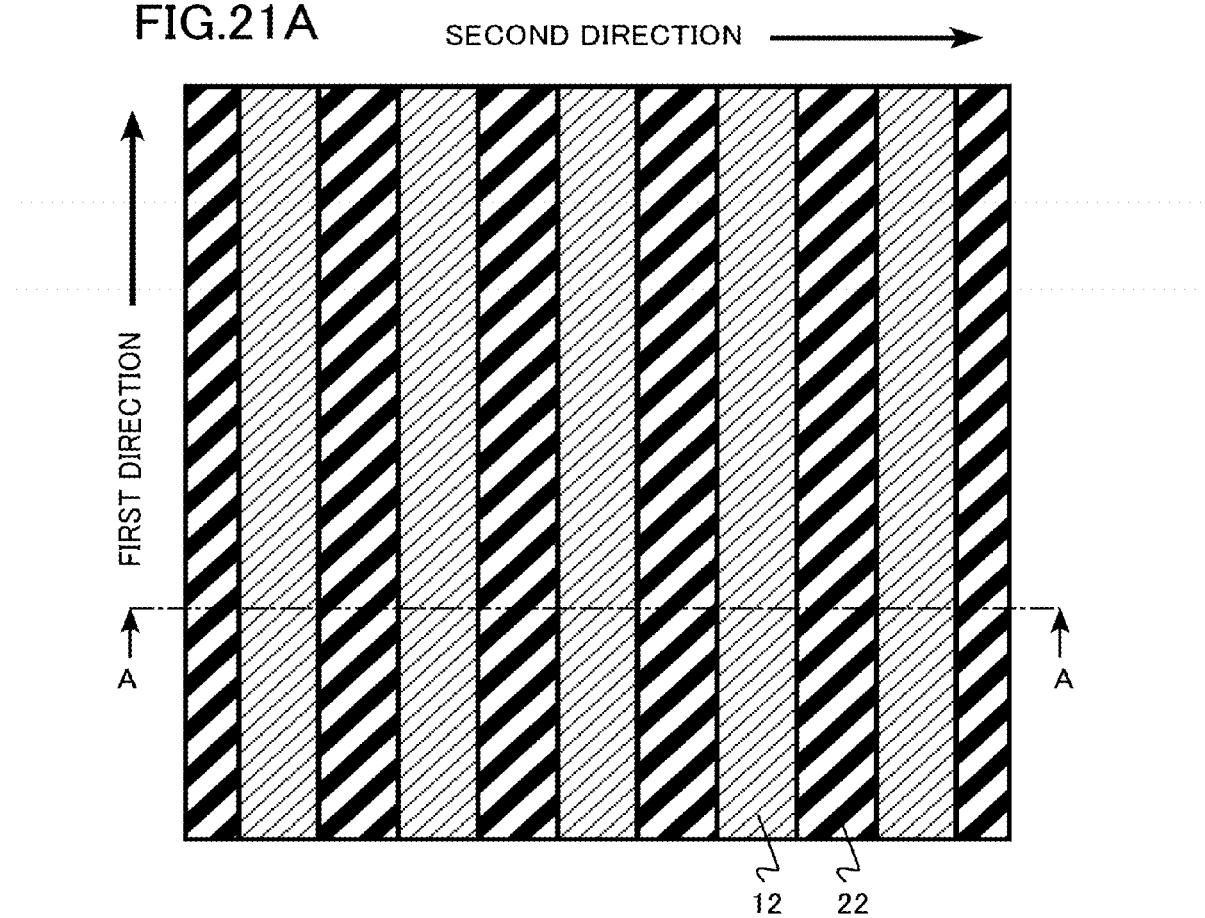
FIGS. 21A and 21B are schematic views showing the memory device in the middle of manufacturing in the method for manufacturing the memory device of the second embodiment.
Figure 21B:
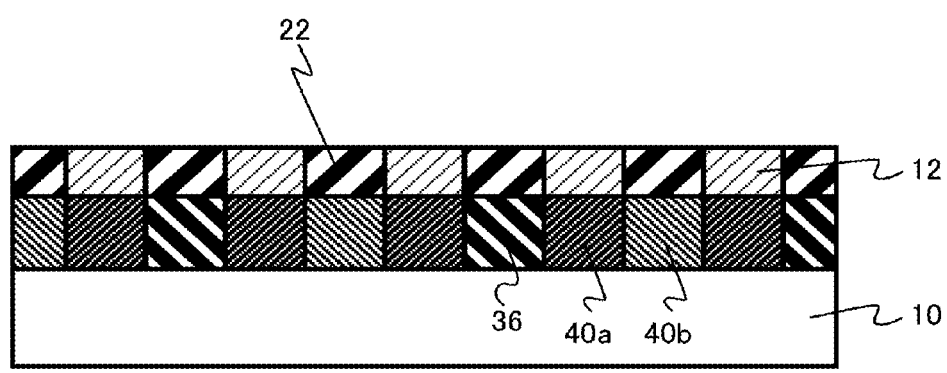

Next, the first insulating film 22 is formed between the first metal wiring layers 12 (FIGS. 21A, 21B). The first insulating film 22 is formed, for example, by deposition of the insulating film by means of CVD, and polishing by means of CMP.

Steps thereafter are similar to those in the first embodiment.

According to the present embodiment, similar to the first embodiment, it is possible to reduce manufacturing cost of the memory device. It is thus possible to realize scaling-down of the memory device.

Third Embodiment

A method for manufacturing metal wiring of the present embodiment includes: forming on a substrate a block copolymer layer which contains a first polymer and a second polymer having lower surface energy than that of the first polymer; performing thermal treatment on the block copolymer layer, to separate the block copolymer layer such that a first phase containing the first polymer and extending in the first direction and a second phase containing the second polymer and extending in the first direction are alternately arrayed; and selectively forming on a surface of the first phase a metal wiring layer extending in the first direction.

A method for forming wiring layer in the present embodiment is similar to the method for forming the first metal wiring layer in the first embodiment except that the wiring is formed not on the semiconductor substrate but on the insulating layer. Hence descriptions of contents overlapping those of the first embodiment will be omitted.

In the present embodiment, a description will be given by taking as an example a case where a metal wiring layer is further formed on the second metal wiring layer of the memory device of the first embodiment.

FIGS. 22 to 25 are schematic views showing metal wiring in the middle of manufacturing in the method for manufacturing metal wiring of the present embodiment.

First, there is prepared a substrate 50 where an insulating layer 38 is formed on the second metal wiring layer 14 of the memory device of the first embodiment. The insulating layer 38 is formed, for example, by CVD. The insulating layers 38 is, for example, a silicon oxide film.

Figure 22:
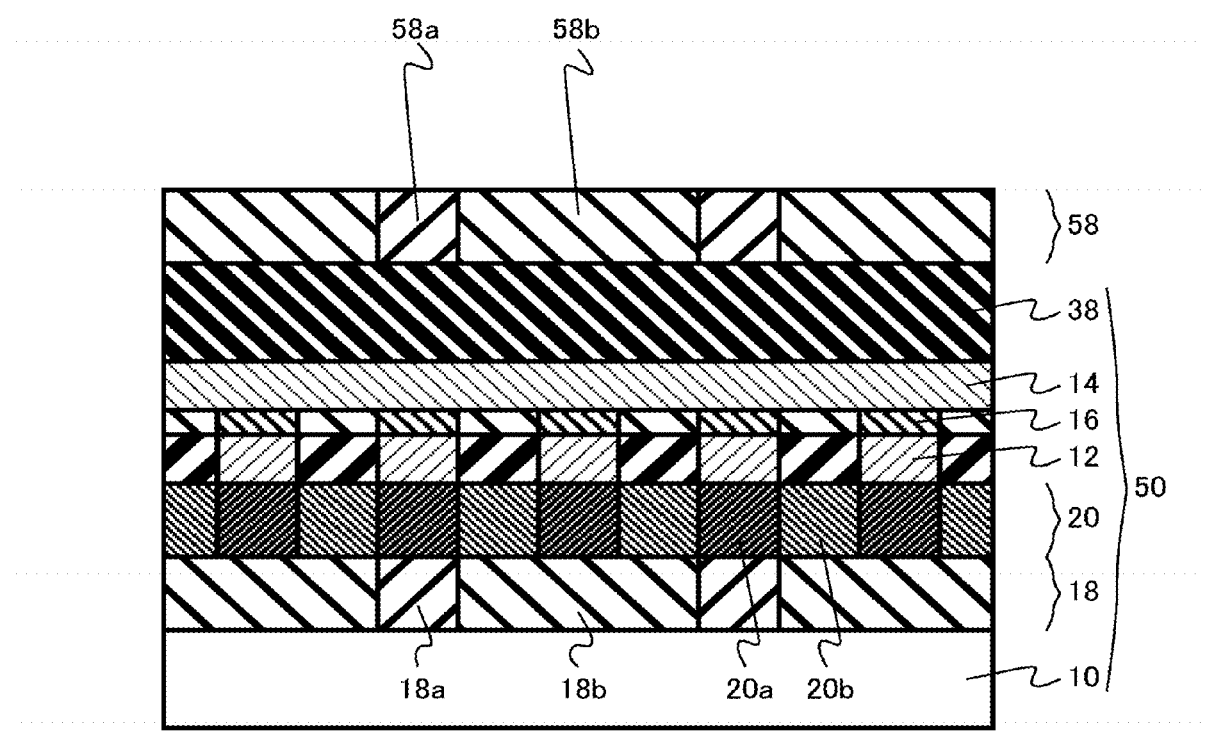
FIG. 22 is a schematic sectional view showing metal wiring in the middle of manufacturing in a method for manufacturing a memory device of a third embodiment.

Next, a guide layer 58, where a first region 58*a* with relatively high surface energy and a second region 58*b* with relatively low surface energy are alternately arrayed, is formed on the substrate 50, namely the surface of the insulating layer 38 (FIG. 22).

Figure 23:
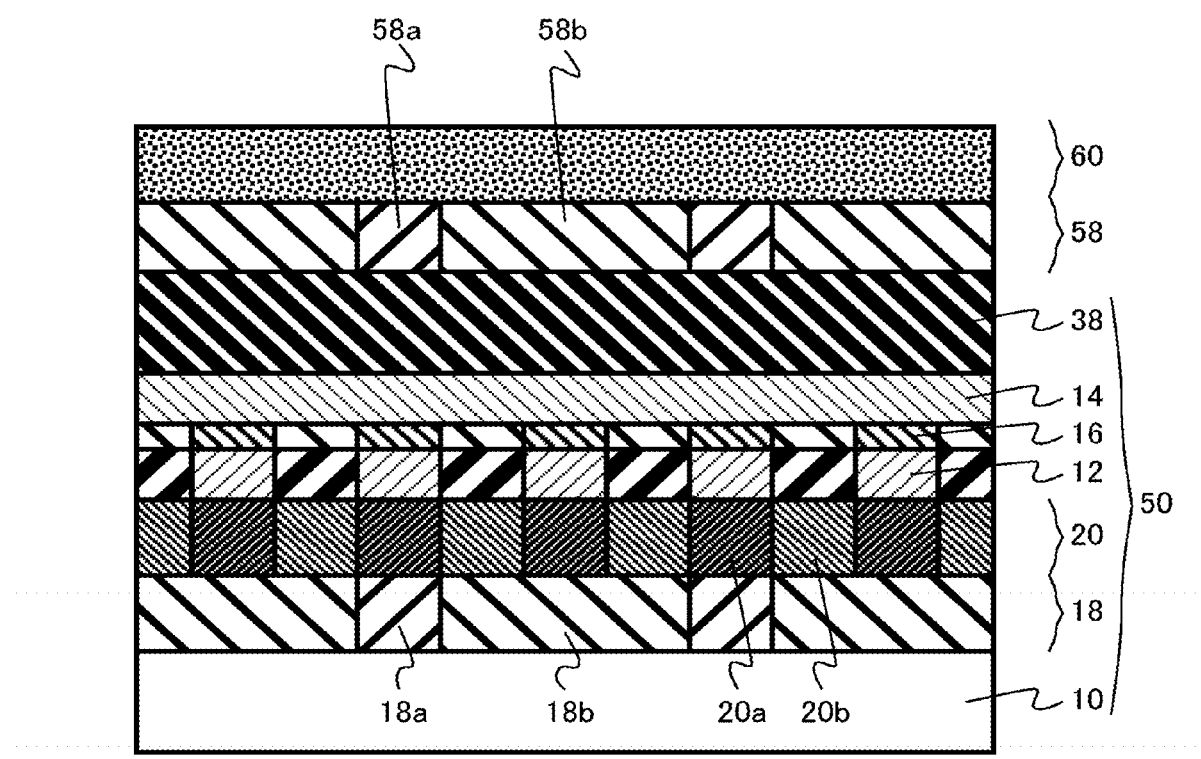
FIG. 23 is a schematic sectional view showing the metal wiring in the middle of manufacturing in the method for manufacturing the memory device of the third embodiment.

A block copolymer layer 60 is formed on the guide layer 58 (FIG. 23). The block copolymer layer GO contains the first polymer and the second polymer having lower surface energy than that of the first polymer.

Figure 24:
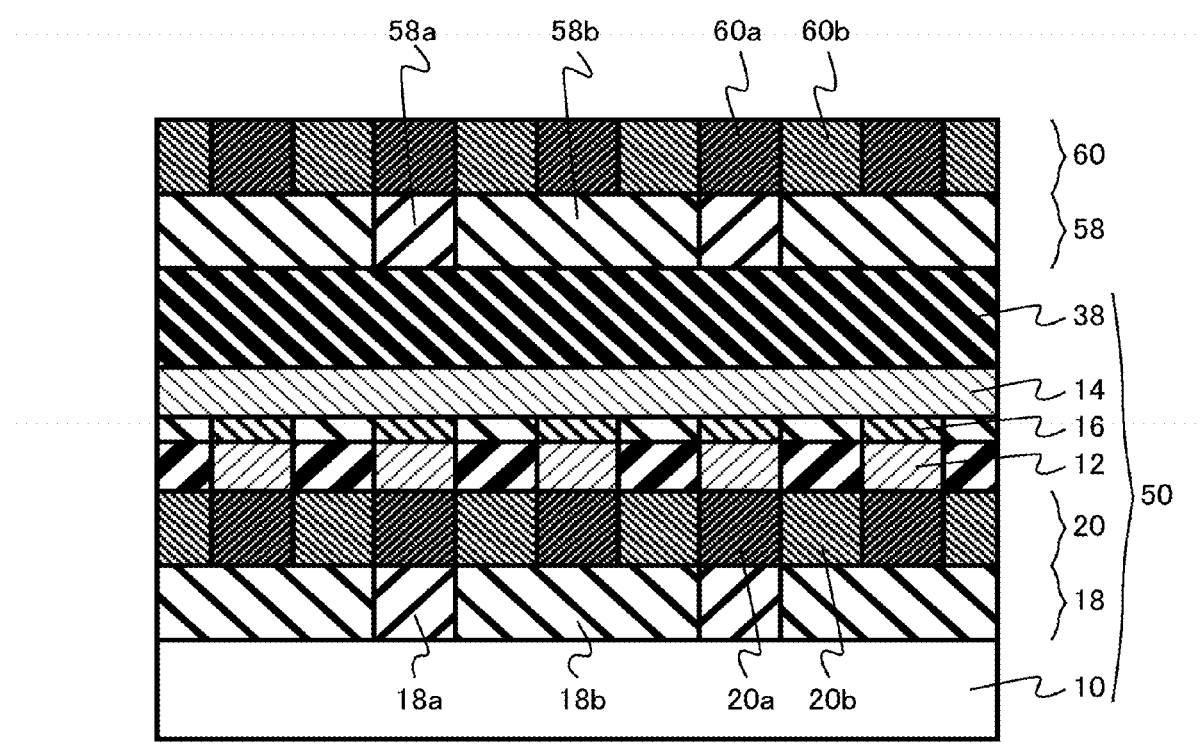
FIG. 24 is a schematic sectional view showing the metal wiring in the middle of manufacturing in the method for manufacturing the memory device of the third embodiment.

Next, the block copolymer layer 60 is thermally treated and separated into the first phase 60*a* and the second phase 60*b* (FIG. 24). The first phase 60*a* contains the first polymer and extends in the first direction. The second phase 60*b* contains the second polymer and extends in the first direction. By the separation, the first phase 60*a* and the second phase 60*b* are alternately arrayed. It should be noted that in the present embodiment, the first direction is similar to a direction shown in FIG. 1A of the first embodiment.

Figure 25:
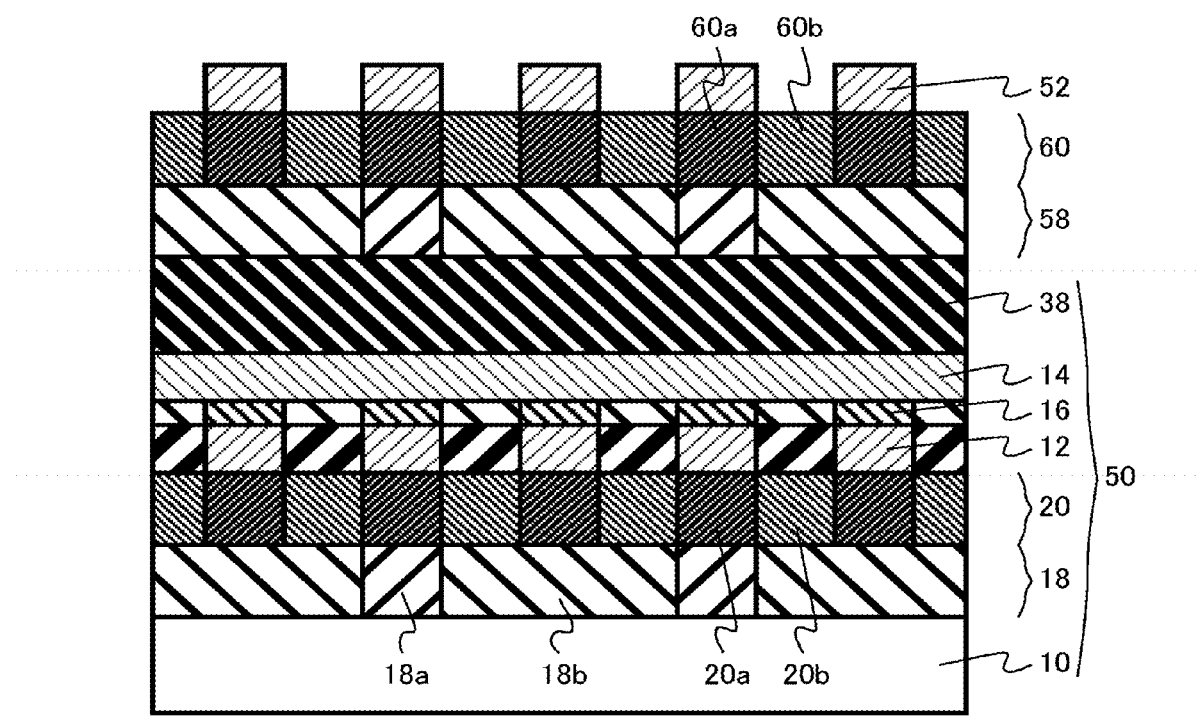
FIG. 25 is a schematic sectional view showing the metal wiring in the middle of manufacturing in the method for manufacturing the memory device of the third embodiment.

Next, a metal wiring layer 52 extending in the first direction is selectively formed on the surface of the first phase 60*a* (FIG. 25). The metal wiring layer 52 is selectively formed on the surface of the first phase 60*a* with high surface energy as compared with that of the second phase 60*b*.

According to the present embodiment, it is possible to reduce manufacturing cost of the metal wiring.

It should be noted that the method for manufacturing metal wiring of the present embodiment is applicable in a broad range so long as the metal wiring is to be formed on the substrate, such as a wiring layer of a logic device or wiring on a circuit board.

Fourth Embodiment

A method for manufacturing a memory device of the present embodiment is different from the third embodiment in that a metal wiring layer is selectively formed not on the first phase 60a of the block copolymer layer 60 but between the first phases 60a with the second phase 60b having been eliminated.

FIGS. 26 to 29 are schematic sectional views showing metal wiring in the middle of manufacturing in the method for manufacturing metal wiring of the present embodiment.

Figure 26:
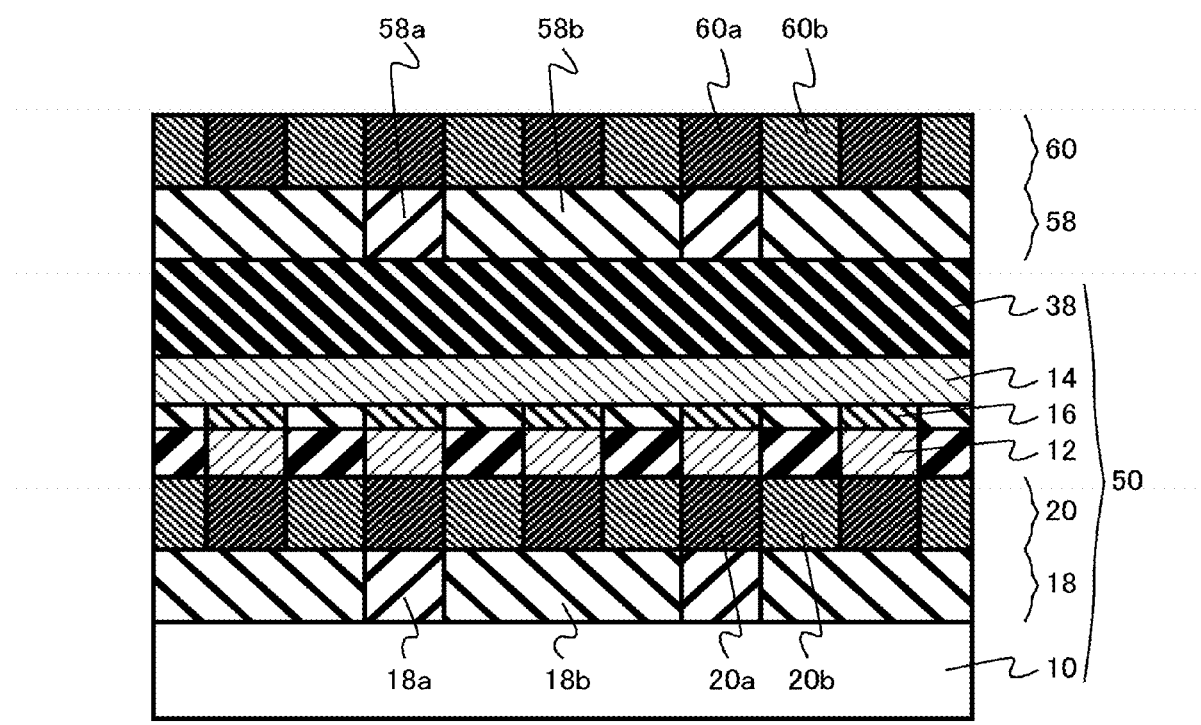
FIG. 26 is a schematic sectional view showing metal wiring in the middle of manufacturing in a method for manufacturing a memory device of a fourth embodiment.

The method is similar to the third embodiment until formation of the guide layer 58 (FIG. 26).

Figure 27:
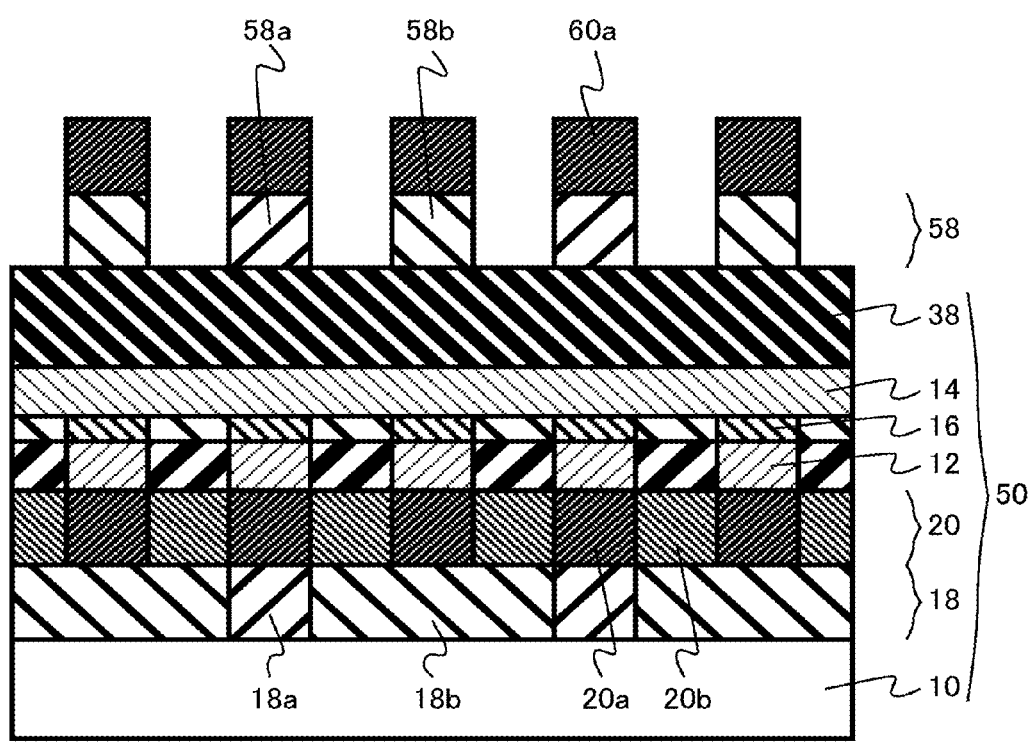
FIG. 27 is a schematic sectional view showing the metal wiring in the middle of manufacturing in the method for manufacturing the memory device of the fourth embodiment.

Next, the second phase 60b is selectively eliminated with respect to the first phase 60a. At this time, the second guide layer 58 as a lower layer of the second phase 60b is also eliminated until the surface of the insulating layer 38 as a lower layer of the second guide layer 58 is exposed (FIG. 27). The second phase 60b and the second guide layer 58 are etched and eliminated by RIE by use of a fluorine-based or oxygen-based gas.

Figure 28:
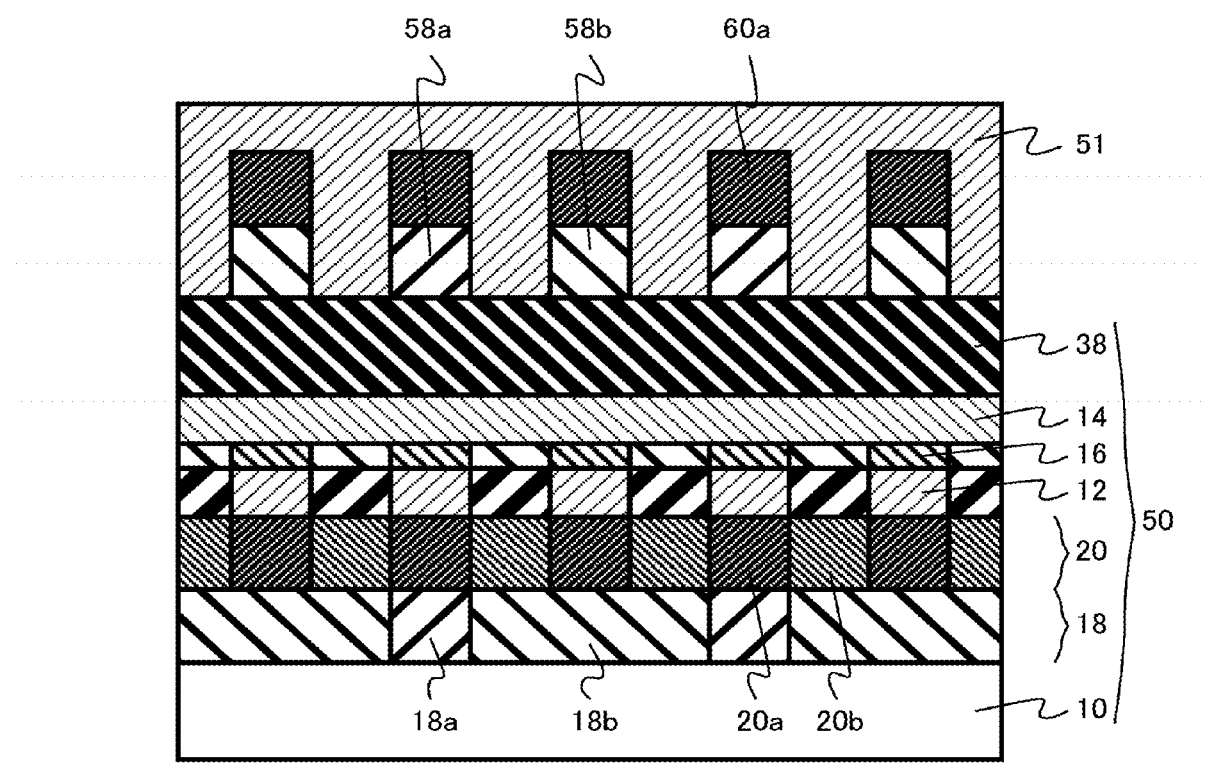
FIG. 28 is a schematic sectional view showing the metal wiring in the middle of manufacturing in the method for manufacturing the memory device of the fourth embodiment.
Figure 29:
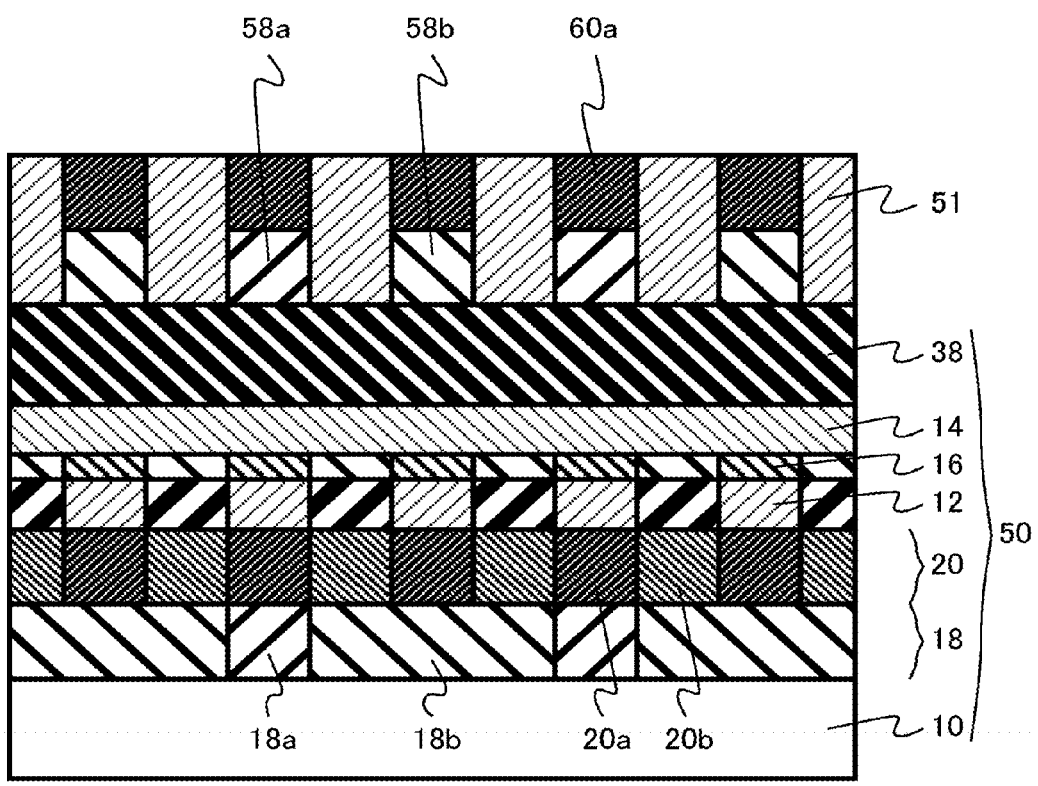
FIG. 29 is a schematic sectional view showing the metal wiring in the middle of manufacturing in the method for manufacturing the memory device of the fourth embodiment.

Next, a film of metal 51 is formed on the whole surface, for example, by CVD, electroless plating, ALD or the like (FIG. 28). Subsequently, the metal 51 is polished for example by CMP until the surface of the first phase 60a is exposed (FIG. 29).

Figure 30:
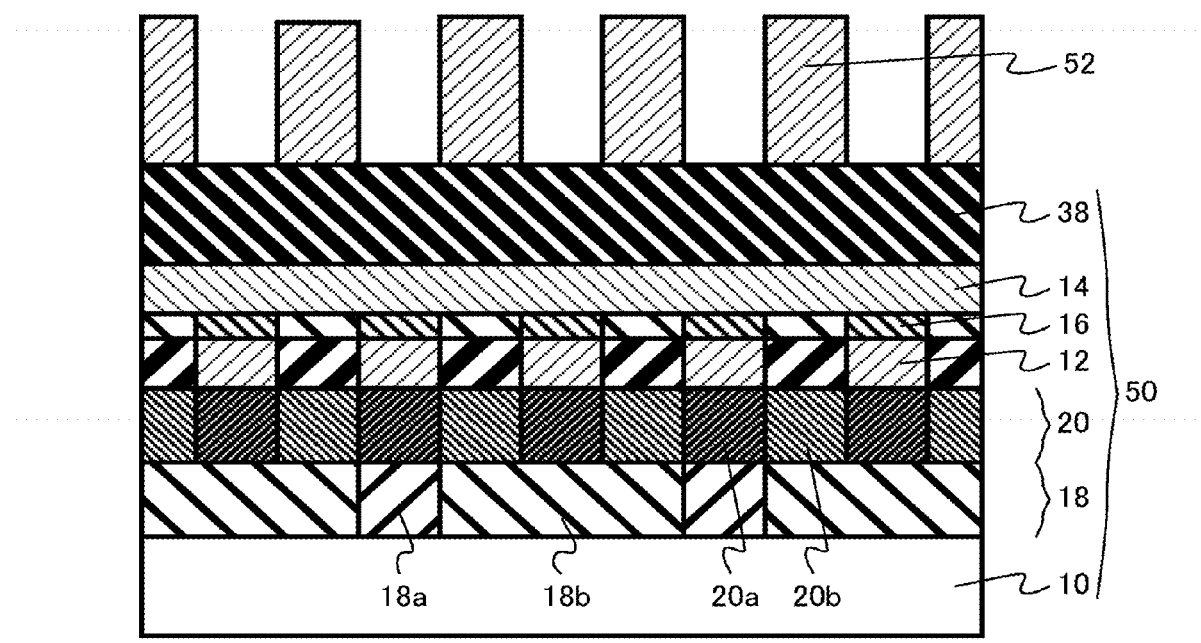
FIG. 30 is a schematic sectional view showing the metal wiring in the middle of manufacturing in the method for manufacturing the memory device of the fourth embodiment.

Thereafter, the first phase 60a and the second guide layer 58 are removed by dry etching or wet etching (FIG. 30). By the above steps, the metal wiring layer 52 extending in the first direction is formed. It should be noted that in the present embodiment, the first direction is similar to a direction shown in FIG. 1A of the first embodiment.

According to the present embodiment, it is possible to reduce manufacturing cost of the metal wiring.

EXAMPLES

In the following, examples will be described.

Example 1

Hereinafter, there will be described a specific example of the manufacturing method of the first embodiment.

Irradiation is performed with UV light by a low-pressure mercury lamp for five minutes to induce a hydroxyl group on the surface of a Si-substrate (substrate). The Si-substrate after the UV treatment is spin-coated with an ethyl lactate solution (concentration of 0.5 wt %) of a poly(4-hydroxystyrene)-polymethyl methacrylate random copolymer (PHS-r-PMMA) having a hydroxyl group at one end at a speed of revolution of 2000 rpm. It should be noted that the PHS-r-PMMA used has a molar weight Mn=50,000, a polydispersity Mw/Mn=1.05, and a volume fraction $f_{PHS}$=0.5.

After a solvent contained in the PHS-r-PMMA thin film is eliminated at 110° C./90 sec, annealing is performed at 150° C./8 h for producing crosslinking reaction between a hydroxyl group on the surface of the Si-substrate and PHS-r-PMMA. Subsequently, non-crosslinked excess PHS-r-PMMA is rinsed by ethyl lactate. When a contact angle of the PHS-r-PMMA thin film on water is evaluated, it is found to be almost a medium of a contact angle of a PHS thin film and a contact angle of PMMA. Further, when a film thickness of the PHS-r-PMMA thin film is evaluated by AFM, it can be confirmed to be about 5 nm.

Next, an L&S guide pattern is made on the PHS-r-PMMA thin film by photo lithography. The top of the PHS-r-PMMA thin film is spin-coated at 1500 rpm/30 sec by use of SOG080 manufactured by JSR Corporation to form an SOG (Spin On Glass) layer (film thickness: 45 nm). Subsequently, a photoresist for ArF is spin-coated at 1500 rpm/35 sec, and pre-baked at 120° C./90 sec. A photoresist/SOG/PHS-r-PMMA stacked film is exposed with an L&S pattern by an ArF excimer laser exposure device. An exposure value is set to 25 mJ/cm$^2$, and a pattern cycle is set to 100 nm. After PEB (Post Exposure Bake) is performed at 125° C./60 sec, development is performed at 2.38% TMAH (Tetra Methyl Ammonium Hydroxide).

Thereafter, RIE is performed with O$_2$, and the RIE is performed on the SOG layer and the PHS-r-PMMA thin film with a fluorine-based gas until the Si-surface of the substrate appears. Then, residues of the photoresist, the SOG and the like are eliminated by TMY (Trimethyl-2-hydroxyethyl ammonium hydroxide). When the formed PHS-r-PMMA thin film pattern (first region) is observed by SEM, it is found to be an L&S (Line & Space) pattern with a cycle of 100 nm.

Further, irradiation is performed with UV light by the low-pressure mercury lamp for five minutes to induce a hydroxyl group on the surface of the Si-substrate. The Si-substrate after the UV treatment is spin-coated with an ethyl lactate solution (concentration of 0.5 wt %) of poly (4-hydroxystyrene) (PHS-OH) having a hydroxyl group at one end at a speed of revolution of 2000 rpm. It should be noted that the PHS-OH used has a molar weight Mn=50,000 and a polydispersity Mw/Mn=1.05. After a solvent contained in the PHS-OH thin film is eliminated at 110° C./90 sec, annealing is performed at 150° C./8 h for producing crosslinking reaction between a hydroxyl group on the surface of the Si-substrate and PHS-OH. Subsequently, non-crosslinked excess PHS-OH is rinsed by ethyl lactate. The exposed Si-surface is covered by a PHS thin film (second region) having a thickness of about 5 nm.

Next, the top of the PHS-r-PMMA/PHS thin film (first guide layer) formed with an L&S pattern is spin-coated with an ethyl lactate solution (concentration of 2 wt %) of a poly(4-hydroxystyrene)-polymethyl methacrylate block copolymer (PHS-b-PMMA) (first block copolymer layer) at a speed of revolution of 2000 rpm. It should be noted that the PHS-b-PMMA used has a molar weight Mn=122,000, a polydispersity Mw/Mn=1.08, and a volume fraction $f_{PHS}$=0.5.

After a solvent contained in the PHS-b-PMMA thin film is eliminated at 110° C./90 sec, annealing is performed at 200° C./8 h for separating PHS-b-PMMA into a PHS phase (first phase) and a PMMA phase (second phase). Subsequently, observation is performed by AFM for confirming the pattern. When the AFM observation is performed, it is found that an L&S pattern with a cycle of 50 nm has been formed.

Subsequently, a film of tungsten (first metal wiring layer) is selectively formed only on the PHS phase (first phase) by ALD. Since PHS has a hydroxyl group, it reacts with a tungsten precursor, and hence the film of tungsten can only be formed on the PHS phase. As a precursor for forming tungsten, WF$_6$ and Si$_2$H$_6$ are used to form a film with a substrate temperature of 180° C. When the PHS-b-PMMA film formed with the film of tungsten is observed by cross-sectional SEM, a film of tungsten having a width of 25 nm and a height of 20 nm is selectively formed on the PHS phase.

Subsequently, a film of $SiO_2$ (first insulating film) is formed, to bring the tungsten layer into the state of not being exposed on the surface. Next, CMP is performed, to flatten the surface until the tungsten layer is exposed.

After the flattening, irradiation is performed with UV light by the low-pressure mercury lamp for five minutes to induce a hydroxyl group on the surface of $SiO_2$. The substrate after the UV treatment is spin-coated with an ethyl lactate solution (concentration of 0.5 wt %), obtained by mixing PHS-r-PMMA having a hydroxyl group at one end and PHS-r-PMMA having a thiol group at one end at a ratio of 1:1, at a speed of revolution of 2000 rpm. It should be noted that the two kinds of PHS-r-PMMA used each have a molar weight Mn=50,000, a polydispersity Mw/Mn=1.05, and a volume fraction $f_{PHS}$=0.5.

After a solvent contained in the PHS-r-PMMA thin film is eliminated at 110° C./90 sec, annealing is performed at 150° C./8 h for producing crosslinking reaction between a hydroxyl group on the surface of the $SiO_2$ and PHS-r-PMMA. Subsequently, non-crosslinked excess PHS-r-PMMA is rinsed by ethyl lactate.

Next, spin coating is performed at 1500 rpm/30 sec by use of SOG080 manufactured by JSR Corporation to form an SOG layer (film thickness: 45 nm). Subsequently, a photoresist for ArF is spin-coated at 1500 rpm/35 sec, and pre-baked at 120° C./90 sec.

A photoresist/SOG/PHS-r-PMMA stacked film is exposed with an L&S pattern by the ArF excimer laser exposure device. An exposure value is set to 25 mJ/cm$^2$, and a pattern cycle is set to 100 nm. Further, this L&S pattern is orthogonal to the L&S pattern of the foregoing tungsten layer. After PEB is performed at 125° C./60 sec, development is performed at 2.38% TMAH.

Thereafter, RIE is performed on the SOG layer and the PHS-r-PMMA thin film with a fluorine-based gas until the surface of tungsten appears. Then, residues of the photoresist, the SOG and the like are eliminated by TMY. A PHS-r-PMMA thin film pattern (third region) is formed.

Further, irradiation is performed with UV light by the low-pressure mercury lamp for five minutes to induce a hydroxyl group on the surface of $SiO_2$. The substrate after the UV treatment is spin-coated with an ethyl lactate solution (concentration of 0.5 wt %), obtained by mixing poly (4-hydroxystyrene) (PHS-OH) having a hydroxyl group at one end and polymethyl methacrylate (PHS-SH) having a thiol group at one end at a ratio of 1:1, at a speed of revolution of 2000 rpm. It should be noted that the two kinds of PHS used each have a molar weight Mn=50,000 and a polydispersity Mw/Mn=1.05. After a solvent contained in the PHS thin film is eliminated at 110° C./90 sec, annealing is performed at 150° C./8 h for producing crosslinking reaction between a hydroxyl group on the surface of the $SiO_2$-substrate and PHS-OH. Subsequently, non-crosslinked excess PHS-OH and PHS-SH are rinsed by ethyl lactate. The exposed $SiO_2$ and the surface of tungsten are covered by a PHS thin film (fourth region) having a thickness of about 5 nm.

Next, the top of the PHS-r-PMMA thin film (second guide layer) formed with an L&S pattern is spin-coated with an ethyl lactate solution (concentration of 2 wt %) of a PHS-b-PMMA (second block copolymer layer) at a speed of revolution of 2000 rpm. It should be noted that the used PHS-b-PMMA has a molar weight Mn=122,000, a polydispersity Mw/Mn=1.08, and a volume fraction $f_{PHS}$=0.5.

After a solvent contained in the PHS-b-PMMA thin film is eliminated at 110° C./90 sec, annealing is performed at 200° C./8 h for separating PHS-b-PMMA into a PHS phase (third phase) and a PMMA phase (fourth phase). Subsequently, observation is performed by AFM for confirming the pattern. When the AFM observation is performed, it is found that an L&S pattern with a cycle of 50 nm has been formed. However, the formed L&S pattern is orthogonal to the L&S pattern of tungsten and $SiO_2$ as a lower layer.

Subsequently, after the PMMA phase (fourth phase) of the PHS-b-PMMA thin film (second block copolymer layer) is selectively eliminated by a fluorine-based gas, the PHS-r-PMMA thin film (third region) and the PMMA thin film (fourth region) as a lower layer are subjected to RIE by a fluorine-based gas until the surface of tungsten (first metal wiring layer) appears.

Thereafter, an organic molecular layer (memory layer) is selectively formed only on the tungsten layer. A modules used for the organic molecular layer is a derivative of 4-[2-nitro-5-amino-4-(phenylethynyl)phenylethynyl]benzenethiol, and an SAM is formed only on a metal layer. A molecular toluene solution with a concentration of 1 mM is prepared, and the foregoing L&S pattern substrate is immersed into the solution for 24 hours. After the immersion, excess molecules not adsorbed to tungsten are rinsed by toluene and ethanol. Since the molecule has a thiol group at one end, it is not absorbed onto the $SiO_2$ layer, and an SAM is formed only on the tungsten layer.

Subsequently, an alkyl molecular layer (second insulating film) is formed only on $SiO_2$ by use of alkyl molecules with the carbon number 8 having a thiol group at one end and a hydroxyl group at the other end. An alkyl molecular toluene solution with a concentration of 1 mM is prepared, and the foregoing L&S pattern substrate after the formation of the organic molecular layer is immersed into the solution for 24 hours. After the immersion, excess alkyl molecules not adsorbed to $SiO_2$ are rinsed by toluene and ethanol. Since the molecule has the hydroxyl group at one end, it is absorbed only onto the $SiO_2$ layer, and the thiol group on the other end is exposed on the surface.

Finally, a film of tungsten (second metal wiring layer) is selectively formed by ALD only on the organic molecular layer and the alkyl molecular layer. As a precursor for forming tungsten, $WF_6$ and $Si_2H_6$ are used to form a film with a substrate temperature of 180° C. An L&S pattern of tungsten with a cycle of 50 nm is formed. When a cross section of a memory device manufactured in the above manufacturing method is observed by TEM, an organic molecular layer having a thickness of about 2 nm and sandwiched between the tungsten layers can be confirmed. It should be noted that the tungsten layers as an upper part and a lower part than the organic molecular layer have the L&S patterns and are orthogonal to each other.

Example 2

A memory device is manufactured by a similar manufacturing method to that of Example 1 except that an alkyl molecular layer (second insulating film) is formed only on $SiO_2$ by use of alkyl molecules with the carbon number 8 having an amino group at one end and a hydroxyl group at the other end. When a cross section of the manufactured memory device is observed by TEM, an organic molecular layer having a thickness of about 2 nm and sandwiched between the tungsten layers can be confirmed.

Example 3

A memory device is manufactured by a similar manufacturing method to that of Example 1 except that an alkyl molecular layer (second insulating film) is formed only on $SiO_2$ by use of alkyl molecules with the carbon number 8 having a thiol group at one end and a silanol group at the other end. When a cross section of the manufactured memory device is observed by TEM, an organic molecular layer having a thickness of about 2 nm and sandwiched between the tungsten layers can be confirmed.

Example 4

A memory device is manufactured by a similar manufacturing method to that of Example 1 except that an alkyl molecular layer (second insulating film) is formed only on $SiO_2$ by use of alkyl molecules with the carbon number 8 having an amino group at one end and a silanol group at the other end. When a cross section of the manufactured memory device is observed by TEM, an organic molecular layer having a thickness of about 2 nm and sandwiched between the tungsten layers can be confirmed.

Example 5

Hereinafter, another specific example of the manufacturing method of the first embodiment will be described.

Irradiation is performed with UV light by a low-pressure mercury lamp for five minutes to induce a hydroxyl group on the surface of a Si-substrate. The Si-substrate after the UV treatment is spin-coated with a propyleneglycol monomethylether acetate (PGMEA) solution (concentration of 0.5 wt %) of a polysthyrene-poly(2-vinylpyridine) random copolymer (PS-r-P2VP) having a hydroxyl group at one end at a speed of revolution of 2000 rpm. It should be noted that the PS-r-P2VP used has a molar weight Mn=50,000, a polydispersity Mw/Mn=1.05, and a volume fraction $f_{P2VP}$=0.5.

After a solvent contained in the PS-r-2VP thin film is eliminated at 110° C./90 sec, annealing is performed at 150° C./8 h for producing crosslinking reaction between a hydroxyl group on the surface of the Si-substrate and PS-r-P2VP. Subsequently, non-crosslinked excess PS-r-P2VP is rinsed by ethyl lactate. When a contact angle of the PS-r-P2VP thin film on water is evaluated, it is found to be almost a medium of 70° between a contact angle of 87.5° of a PS thin film and a contact angle of 52.5° of P2VP. Further, when a film thickness of the PS-r-P2VP thin film is evaluated by AFM, it can be confirmed to be about 5 nm.

Next, an L&S guide pattern is made on the PS-r-P2VP thin film by photo lithography. The top of the PS-r-P2VP thin film is spin-coated at 1500 rpm/30 sec by use of SOG080 manufactured by JSR Corporation to form an SOG layer (film thickness: 45 nm). Subsequently, a photoresist for ArF is spin-coated at 1500 rpm/35 sec, and pre-baked at 120° C./90 sec. A photoresist/SOG/PS-r-P2VP stacked film is exposed with an L&S pattern by the ArF excimer laser exposure device. An exposure value is set to 25 mJ/cm², and a pattern cycle is set to 100 nm. After PEB is performed at 125° C./60 sec, development is performed at 2.38% TMAH.

Thereafter, RIE is performed with $O_2$, and the RIE is performed on the SOG layer and the PS-r-P2VP thin film with a fluorine-based gas until the Si-surface of the substrate appears. Then, residues of the photoresist, the SOG and the like are eliminated by TMY. When the formed PS-r-P2VP thin film pattern (first region) is observed by SEM, it is found to be an L&S pattern with a cycle of 100 nm.

Further, irradiation is performed with UV light by the low-pressure mercury lamp for five minutes to induce a hydroxyl group on the surface of the Si-substrate. The Si-substrate after the UV treatment is spin-coated with a PGMEA solution (concentration of 0.5 wt %) of poly(2-vinylpyridine) (P2VP-OH) of a hydroxyl group having a hydroxyl group at one end at a speed of revolution of 2000 rpm. It should be noted that the P2VP-OH used has a molar weight Mn=50,000 and a polydispersity Mw/Mn=1.05. After a solvent contained in the P2VP-OH thin film is eliminated at 110° C./90 sec, annealing is performed at 150° C./8 h for producing crosslinking reaction between a hydroxyl group on the surface of the Si-substrate and P2VP-OH. Subsequently, non-crosslinked excess P2VP-OH is rinsed by PGMEA. The exposed Si-surface is covered by a PS thin film (second region) having a thickness of about 5 nm.

Next, the top of the PS-r-P2VP/P2VP thin film (first guide layer) formed with an L&S pattern is spin-coated with a PGMEA solution (concentration of 2 wt %) of a polysthyrene-poly(2-vinylpyridine) block copolymer (PS-b-P2VP) (first block copolymer layer) at a speed of revolution of 2000 rpm. It should be noted that the PS-b-P2VP used has a molar weight Mn=122,000, a polydispersity Mw/Mn=1.08, and a volume fraction $f_{P2VP}$=0.5.

After a solvent contained in the PS-b-P2VP thin film is eliminated at 110° C./90 sec, annealing is performed at 200° C./8 h for separating PS-b-P2VP into a P2V2 phase (first phase) and a PS phase (second phase). Subsequently, observation is performed by AFM for confirming the pattern. When the AFM observation is performed, it is found that an L&S pattern with a cycle of 50 nm has been formed.

Subsequently, a film of nickel (first metal wiring layer) is selectively formed only on the P2VP phase (first phase) by electroless plating. Since P2VP has a pyridine ring, it can selectively adsorb palladium chloride contained in the electroless plating solution, which as a catalyst causes a reaction of a nickel precursor, and a film of nickel can be formed only on the P2VP phase. A film of nickel is formed by using nickel sulfate as a precursor for forming nickel at a substrate temperature of 70° C. When the PS-b-P2VP film formed with the film of nickel is observed by cross-sectional SEM, a film of nickel having a width of 25 nm and a height of 20 nm is selectively formed on the P2VP phase.

Subsequently, $SiO_2$ (first insulating film) is formed, to bring the nickel layer into the state of not being exposed on the surface. Next, CMP is performed, to flatten the surface until the nickel layer is exposed.

After the flattening, irradiation is performed with UV light by the low-pressure mercury lamp for five minutes to induce a hydroxyl group on the surface of $SiO_2$. The Si-substrate after the UV treatment is spin-coated with a PGMEA solution (concentration of 0.5 wt %), obtained by mixing PS-r-P2VP having a hydroxyl group at one end and PS-r-P2VP having a thiol group at one end at a ratio of 1:1, at a speed of revolution of 2000 rpm. It should be noted that the two kinds of PS-r-P2VP used each have a molar weight Mn=50,000, a polydispersity Mw/Mn=1.05, and a volume fraction $f_{P2VP}$=0.5.

After a solvent contained in the PS-r-P2VP thin film is eliminated at 110° C./90 sec, annealing is performed at 150° C./8 h for producing crosslinking reaction between a hydroxyl group on the surface of the SiO$_2$ and PS-r-P2VP. Subsequently, non-crosslinked excess PS-r-P2VP is rinsed by PGMEA.

Next, spin coating is performed at 1500 rpm/30 sec by use of SOG080 manufactured by JSR Corporation to form an SOG layer (film thickness: 45 nm). Subsequently, a photoresist for ArF is spin-coated at 1500 rpm/35 sec, and pre-baked at 120° C./90 sec. A photoresist/SOG/PS-r-P2VP stacked film is exposed with an L&S pattern by the ArF excimer laser exposure device. An exposure value is set to 25 mJ/cm$^2$, and a pattern cycle is set to 100 nm. Further, this L&S pattern is orthogonal to the L&S pattern of the foregoing tungsten layer. After PEB is performed at 125° C./60 sec, development is performed at 2.38% TMAH.

Thereafter, RIE is performed on the SOG layer and the PS-r-P2VP thin film with a fluorine-based gas until the surface of tungsten appears. Then, residues of the photoresist, the SOG and the like are eliminated by TMY. A PS-r-P2VP thin film pattern (third region) is formed.

Further, irradiation is performed with UV light by the low-pressure mercury lamp for five minutes to induce a hydroxyl group on the surface of SiO$_2$. The substrate after the UV treatment is spin-coated with a PGMEA solution (concentration of 0.5 wt %), obtained by mixing poly(2-vinylpyridine) (P2VP-OH) having a hydroxyl group at one end and poly(2-vinylpyridine) (P2VP-SH) having a thiol group at one end at a ratio of 1:1, at a speed of revolution of 2000 rpm. It should be noted that the two kinds of P2VP used each have a molar weight Mn=50,000 and a polydispersity Mw/Mn=1.05. After a solvent contained in the PS thin film is eliminated at 110° C./90 sec, annealing is performed at 150° C./8 h for producing crosslinking reaction between a hydroxyl group on the surface of the SiO$_2$-substrate and P2VP-OH. Subsequently, non-crosslinked excess P2VP-OH and P2VP-SH are rinsed by ethyl lactate. The exposed SiO$_2$ and the surface of nickel are covered by a P2VP thin film (fourth region) having a thickness of about 5 nm.

Next, the top of the PS-r-P2VP/P2VP thin film (second guide layer) formed with an L&S pattern is spin-coated with a PGMEA solution (concentration of 2 wt %) of a polysthyrene-poly(2-vinylpyridine) block copolymer (PS-b-P2VP) (second block copolymer layer) at a speed of revolution of 2000 rpm. It should be noted that the PS-b-P2VP used has a molar weight Mn=122,000, a polydispersity Mw/Mn=1.08, and a volume fraction $f_{P2VP}$=0.5.

After a solvent contained in the PS-b-P2VP thin film is eliminated at 110° C./90 sec, annealing is performed at 200° C./8 h for separating PS-b-P2VP into a P2V2 phase (third phase) and a PS phase (fourth phase). Subsequently, observation is performed by AFM for confirming the pattern. When the AFM observation is performed, it is found that an L&S pattern with a cycle of 50 nm has been formed. However, the formed L&S pattern is orthogonal to the L&S pattern of nickel and SiO$_2$ as a lower layer.

Subsequently, after the P2VP phase (third phase) of the PS-b-P2VP thin film is selectively eliminated by a fluorine-based gas, the PS-r-P2VP thin film (third region) and the P2VP thin film (fourth region) as a lower layer are subjected to RIE by a fluorine-based gas until the surface of nickel and SiO$_2$ (first insulating film) appear.

Thereafter, an organic molecular layer (memory layer) is selectively formed only on the nickel layer. A modules used for the organic molecular layer is a derivative of 4-[2-nitro-5-amino-4-(phenylethynyl)phenylethynyl]benzenethiol, and an SAM is formed only on a nickel layer. A molecular toluene solution with a concentration of 1 mM is prepared, and the foregoing L&S pattern substrate is immersed into the solution for 24 hours. After the immersion, excess molecules not adsorbed to nickel are rinsed by toluene and ethanol. Since the molecule has the thiol group at one end, it is not absorbed onto the SiO$_2$ layer, and an SAM is formed only on the nickel layer.

Subsequently, an alkyl molecular layer (second insulating film) is formed only on SiO$_2$ by use of alkyl molecules with the carbon number 8 having a thiol group at one end and a hydroxyl group at the other end. An alkyl molecular toluene solution with a concentration of 1 mM is prepared, and the foregoing L&S pattern substrate after the formation of the organic molecular layer is immersed into the solution for 24 hours. After the immersion, excess alkyl molecules not adsorbed to SiO$_2$ are rinsed by toluene and ethanol. Since the molecule has the hydroxyl group at one end, it is absorbed only onto the SiO$_2$ layer, and the thiol group on the other end is exposed on the surface.

Finally, a film of nickel (second metal wiring layer) is selectively formed by electroless plating only on the organic molecular layer and the alkyl molecular layer. A film of nickel is formed by using nickel sulfate as a precursor for forming nickel at a substrate temperature of 70° C. An L&S pattern of nickel with a cycle of 50 nm is formed. When a cross section of a memory device manufactured in the above manufacturing method is observed by TEM, an organic molecular layer having a thickness of about 2 nm and sandwiched between the nickel layers can be confirmed. It should be noted that the nickel layers as an upper part and a lower part than the organic molecular layer have L&S patterns and are orthogonal to each other.

Example 6

A memory device is manufactured by a similar manufacturing method to that of Example 5 except that the manufacturing method in Example 5, in which RIE is performed on the SOG layer and the PS-r-P2VP thin film with a fluorine-based gas until appearance of the surface of tungsten to form a PS-r-P2VP thin film pattern (third region) and thereafter an organic molecular layer (memory layer) is formed, is replaced by the following method.

A PS-r-PMMA thin film pattern (third region) is formed. Further, irradiation is performed with UV light by the low-pressure mercury lamp for five minutes to induce a hydroxyl group on the surface of SiO$_2$. The substrate after the UV treatment is spin-coated with a PGMEA solution (concentration of 0.5 wt %), obtained by mixing PMMA-OH having a hydroxyl group at one end and PMMA-SH having a thiol group at one end at a ratio of 1:1, at a speed of revolution of 2000 rpm. It should be noted that the two kinds of PMMA used each have a molar weight Mn=50,000, and a polydispersity Mw/Mn=1.05. After a solvent contained in the PS thin film is eliminated at 110° C./90 sec, annealing is performed at 150° C./8 h for producing crosslinking reaction between a hydroxyl group on the surface of the SiO$_2$-substrate and PMMA-OH. Subsequently, non-crosslinked excess PMMA-OH and PMMA-SH are rinsed by ethyl lactate. The exposed SiO$_2$ and the surface of nickel are covered by a PMMA thin film (fourth region) having a thickness of about 5 nm.

Next, the top of the PS-r-PMMA/PMMA thin film (second guide layer) formed with an L&S pattern is spin-coated with a PGMEA solution (concentration of 2 wt %) of a PS-b-PMMA (second block copolymer layer) at a speed of revolution of 2000 rpm. It should be noted that the PS-b-

PMMA used has a molar weight Mn=122,000, a polydispersity Mw/Mn=1.08, and a volume fraction $f_{PMMA}$=0.5.

After a solvent contained in the PS-b-PMMA thin film is eliminated at 110° C./90 sec, annealing is performed at 200° C./8 h for separating PS-b-PMMA into a PMMA phase (third phase) and a PS phase (fourth phase). Subsequently, observation is performed by AFM for confirming the pattern. When the AFM observation is performed, it is found that an L&S pattern with a cycle of 50 nm has been formed. However, the formed L&S pattern is orthogonal to the L&S pattern of nickel and $SiO_2$ as a lower layer.

Subsequently, after the PMMA phase (third phase) of the PS-b-PMMA thin film is selectively eliminated by a fluorine-based gas, the PS-r-PMMA thin film (third region) and the PMMA thin film (fourth region) as a lower layer are subjected to RIE by a fluorine-based gas until the surface of nickel appears.

The method after an organic molecular layer (memory layer) is selectively formed only on the nickel layer is similar to that of Example 5. When a cross section of a memory device manufactured in the above manufacturing method is observed by TEM, an organic molecular layer having a thickness of about 2 nm and sandwiched between the nickel layers can be confirmed.

Example 7

A memory device is manufactured by a similar manufacturing method to that of Example 5 except that an alkyl molecular layer (second insulating film) is formed only on $SiO_2$ by use of alkyl molecules with the carbon number 8 having an amino group at one end and a hydroxyl group at the other end. When a cross section of the manufactured memory device is observed by TEM, an organic molecular layer having a thickness of about 2 nm and sandwiched between the tungsten layers can be confirmed.

Example 8

A memory device is manufactured by a similar manufacturing method to that of Example 5 except that an alkyl molecular layer (second insulating film) is formed only on $SiO_2$ by use of alkyl molecules with the carbon number 8 having a thiol group at one end and a silanol group at the other end. When a cross section of the manufactured memory device is observed by TEM, an organic molecular layer having a thickness of about 2 nm and sandwiched between the tungsten layers can be confirmed.

Example 9

A memory device is manufactured by a similar manufacturing method to that of Example 1 except that an alkyl molecular layer (second insulating film) is formed only on $SiO_2$ by use of alkyl molecules with the carbon number 8 having an amino group at one end and a silanol group at the other end. When a cross section of the manufactured memory device is observed by TEM, an organic molecular layer having a thickness of about 2 nm and sandwiched between the tungsten layers can be confirmed.

Example 10

Hereinafter, there will be described a specific example of the manufacturing method of the second embodiment.

First, a groove using $SiO_2$ is formed on the surface of a Si-substrate (substrate) by deposition by means of CVD, photo lithography, and RIE. A width of the groove is set to 500 nm, and a depth thereof to 50 nm.

Next, a film of PS-b-P2V2 (second block copolymer layer) is formed in the groove 37. It should be noted that the PS-b-P2V2 used has a molar weight Mn=122,000, a polydispersity Mw/Mn=1.08, and a volume fraction $f_{P2V2}$=0.25.

Thereafter, PS-b-P2V2 is separated by thermal treatment into a P2V2 phase (first phase) and a PS phase (second phase).

Subsequently, a film of nickel (first metal wiring layer) is selectively formed only on the P2VP phase (first phase) by electroless plating. When the PS-b-P2VP film formed with the film of nickel is observed by cross-sectional SEM, a film of nickel having a width of 25 nm and a height of 20 nm is selectively formed on the P2VP phase.

Subsequently, $SiO_2$ (first insulating film) is formed to bring the nickel layer into the state of not being exposed on the surface. Next, CMP is performed to flatten the surface until the nickel layer is exposed.

Thereafter, a memory device is manufactured in a similar method to that of Example 2. When a cross section of a memory device manufactured in the above manufacturing method is observed by TEM, an organic molecular layer having a thickness of about 2 nm and sandwiched between the nickel layers can be confirmed. It should be noted that the nickel layers as an upper part and a lower part than the organic molecular layer have L&S patterns and are orthogonal to each other.

Example 11

Hereinafter, there will be described a specific example of the manufacturing method of the third embodiment.

A memory device which has an organic molecular layer having a thickness of about 2 nm and sandwiched between the tungsten layers are formed by a similar manner to that of Example 1.

Further, a $SiO_2$ (insulating layer) is formed on the tungsten layer (second metal wiring layer) as an upper layer.

Irradiation is performed with UV light by the low-pressure mercury lamp for five minutes to induce a hydroxyl group on the surface of $SiO_2$ (insulating layer). The Si-substrate after the UV treatment is spin-coated with an ethyl lactate solution (concentration of 0.5 wt %) of a poly(4-hydroxystyrene)-polymethyl methacrylate random copolymer (PHS-r-PMMA) having a hydroxyl group at one end at a speed of revolution of 2000 rpm. It should be noted that the PHS-r-PMMA used has a molar weight Mn=50,000, a polydispersity Mw/Mn=1.05, and a volume fraction $f_{PHS}$=0.5.

After a solvent contained in the PHS-r-PMMA thin film is eliminated at 110° C./90 sec, annealing is performed at 150° C./8 h for producing crosslinking reaction between a hydroxyl group on the surface of the Si-substrate and PHS-r-PMMA. Subsequently, non-crosslinked excess PHS-r-PMMA is rinsed by ethyl lactate. When a contact angle of the PHS-r-PMMA thin film on water is evaluated, it is found to be almost a medium of a contact angle of a PHS thin film and a contact angle of PMMA. Further, when a film thickness of the PHS-r-PMMA thin film is evaluated by AFM, it can be confirmed to be about 5 nm.

Next, an L&S guide pattern is made on the PHS-r-PMMA thin film by photo lithography. The top of the PHS-r-PMMA thin film is spin-coated at 1500 rpm/30 sec by use of SOG080 manufactured by JSR Corporation to form an SOG (Spin On Glass) layer (film thickness: 45 nm). Subsequently, a photoresist for ArF is spin-coated at 1500 rpm/35 sec, and pre-baked at 120° C./90 sec. A photoresist/SOG/PHS-r-PMMA stacked film is exposed with an L&S pattern by the ArF excimer laser exposure device. An exposure value is set to 25 mJ/cm², and a pattern cycle is set to 100 nm. After PEB (Post Exposure Bake) is performed at 125° C./60 sec, development is performed at 2.38% TMAH (Tetra Methyl Ammonium Hydroxide).

Thereafter, RIE is performed with $O_2$, and the RIE is performed on the SOG layer and the PHS-r-PMMA thin film with a fluorine-based gas until the Si-surface of the substrate appears. Then, residues of the photoresist, the SOG and the like are eliminated by TMY (Trimethyl-2-hydroxyethyl ammonium hydroxide). When the formed PHS-r-PMMA thin film pattern (first region) is observed by SEM, it is found to be an L&S (Line & Space) pattern with a cycle of 100 nm.

Further, irradiation is performed with UV light by the low-pressure mercury lamp for five minutes to induce a hydroxyl group on the surface of $SiO_2$ (insulating layer). The $SiO_2$ (insulating layer) after the UV treatment is spin-coated with an ethyl lactate solution (concentration of 0.5 wt %) of poly(4-hydroxystyrene) (PHS-OH) having a hydroxyl group at one end at a speed of revolution of 2000 rpm. It should be noted that the PHS-OH used has a molar weight Mn=50,000 and a polydispersity Mw/Mn=1.05. After a solvent contained in the PHS-OH thin film is eliminated at 110° C./90 sec, annealing is performed at 150° C./8 h for producing crosslinking reaction between a hydroxyl group on the surface of the Si-substrate and PHS-OH. Subsequently, non-crosslinked excess PHS-OH is rinsed by ethyl lactate. The exposed Si-surface is covered by a PHS thin film (second region) having a thickness of about 5 nm.

Next, the top of the PHS-r-PMMA/PHS thin film (guide layer) formed with an L&S pattern is spin-coated with an ethyl lactate solution (concentration of 2 wt %) of a poly (4-hydroxystyrene)-polymethyl methacrylate block copolymer (PHS-b-PMMA) (block copolymer layer) at a speed of revolution of 2000 rpm. It should be noted that the PHS-b-PMMA used has a molar weight Mn=122,000, a polydispersity Mw/Mn=1.08, and a volume fraction $f_{PHS}$=0.5.

After a solvent contained in the PHS-b-PMMA thin film is eliminated at 110° C./90 sec, annealing is performed at 200° C./8 h for separating PHS-b-PMMA into a PHS phase (first phase) and a PMMA phase (second phase).

Subsequently, observation is performed by AFM for confirming the pattern. When the AFM observation is performed, it is found that an L&S pattern with a cycle of 50 nm has been formed.

Subsequently, a film of tungsten (third metal wiring layer) is selectively formed only on the PHS phase (first phase) by ALD. Since PHS has a hydroxyl group, it reacts with a tungsten precursor, and hence the film of tungsten can only be formed on the PHS phase. As a precursor for forming tungsten, $WF_6$ and $Si_2H_6$ are used to form a film with a substrate temperature of 180° C. When the PHS-b-PMMA film formed with the film of tungsten is observed by cross-sectional SEM, a film of tungsten having a width of 25 nm and a height of 20 nm is selectively formed on the PHS phase.

Example 12

Hereinafter, there will be described a specific example of the manufacturing method of the third embodiment.

A memory device which has an organic molecular layer having a thickness of about 2 nm and sandwiched between the tungsten layers are formed by a similar manner to that of Example 5.

Further, a $SiO_2$ (insulating layer) is formed on the tungsten layer (second metal wiring layer) as an upper layer.

Irradiation is performed with UV light by a low-pressure mercury lamp for five minutes to induce a hydroxyl group on the surface of a Si-substrate. The Si-substrate after the UV treatment is spin-coated with a propyleneglycol monomethylether acetate (PGMEA) solution (concentration of 0.5 wt %) of a polysthyrene-poly(2-vinylpyridine) random copolymer (PS-r-P2VP) having a hydroxyl group at one end at a speed of revolution of 2000 rpm. It should be noted that the PS-r-P2VP used has a molar weight Mn=50,000, a polydispersity Mw/Mn=1.05, and a volume fraction $f_{P2VP}$=0.5.

After a solvent contained in the PS-r-2VP thin film is eliminated at 110° C./90 sec, annealing is performed at 150° C./8 h for producing crosslinking reaction between a hydroxyl group on the surface of the Si-substrate and PS-r-P2VP. Subsequently, non-crosslinked excess PS-r-P2VP is rinsed by ethyl lactate. When a contact angle of the PS-r-P2VP thin film on water is evaluated, it is found to be almost a medium of 70° between a contact angle of 87.5° of a PS thin film and a contact angle of 52.5° of P2VP. Further, when a film thickness of the PS-r-P2VP thin film is evaluated by AFM, it can be confirmed to be about 5 nm.

Next, an L&S guide pattern is made on the PS-r-P2VP thin film by photo lithography. The top of the PS-r-P2VP thin film is spin-coated at 1500 rpm/30 sec by use of SOG080 manufactured by JSR Corporation, to form an SOG layer (film thickness: 45 nm). Subsequently, a photoresist for ArF is spin-coated at 1500 rpm/35 sec, and pre-baked at 120° C./90 sec. A photoresist/SOG/PS-r-P2VP stacked film is exposed with an L&S pattern by the ArF excimer laser exposure device. An exposure value is set to 25 mJ/cm², and a pattern cycle is set to 100 nm. After PEB is performed at 125° C./60 sec, development is performed at 2.38% TMAH.

Thereafter, RIE is performed with $O_2$, and the RIE is performed on the SOG layer and the PS-r-P2VP thin film with a fluorine-based gas until the Si-surface of the substrate appears. Then, residues of the photoresist, the SOG and the like are eliminated by TMY. When the formed pattern PS-r-P2VP thin film pattern (first region) is observed by SEM, it is found to be an L&S pattern with a cycle of 100 nm.

Further, irradiation is performed with UV light by the low-pressure mercury lamp for five minutes to induce a hydroxyl group on the surface of the Si-substrate. The Si-substrate after the UV treatment is spin-coated with a PGMEA solution (concentration of 0.5 wt %) of poly(2-vinylpyridine) (P2VP-OH) of a hydroxyl group having a hydroxyl group at one end at a speed of revolution of 2000 rpm. It should be noted that the P2VP-OH used has a molar weight Mn=50,000 and a polydispersity Mw/Mn=1.05. After a solvent contained in the P2VP-OH thin film is eliminated at 110° C./90 sec, annealing is performed at 150° C./8 h for producing crosslinking reaction between a hydroxyl group on the surface of the Si-substrate and P2VP-OH. Subsequently, non-crosslinked excess P2VP-OH is rinsed by PGMEA. The exposed Si-surface is covered by a PS thin film (second region) having a thickness of about 5 nm.

Next, the top of the PS-r-P2VP/P2VP thin film (first guide layer) formed with an L&S pattern is spin-coated with a PGMEA solution (concentration of 2 wt %) of a polysthyrene-poly(2-vinylpyridine) block copolymer (PS-b-P2VP) (first block copolymer layer) at a speed of revolution of 2000 rpm. It should be noted that the PS-b-P2VP used has a molar weight Mn=122,000, a polydispersity Mw/Mn=1.08, and a volume fraction $f_{P2VP}$=0.5.

After a solvent contained in the PS-b-P2VP thin film is eliminated at 110° C./90 sec, annealing is performed at 200° C./8 h for separating PS-b-PMMA into a P2V2 phase (first phase) and a PS phase (second phase). Subsequently, observation is performed by AFM for confirming the pattern. When the AFM observation is performed, it is found that an L&S pattern with a cycle of 50 nm has been formed.

Subsequently, a film of nickel (third metal wiring layer) is selectively formed only on the P2VP phase (first phase) by electroless plating. Since P2VP has a pyridine ring, it can selectively adsorb palladium chloride contained in the electroless plating solution, which as a catalyst causes a reaction of a nickel precursor, and a film of nickel can be formed only on the P2VP phase. A film of nickel is formed by using nickel sulfate as a precursor for forming nickel at a substrate temperature of 70° C. When the PS-b-P2VP film formed with the film of nickel is observed by cross-sectional SEM, a film of nickel having a width of 25 nm and a height of 20 nm is selectively formed on the P2VP phase.

Example 13

Hereinafter, there will be described a specific example of the manufacturing method of the fourth embodiment.

The method is similar to that of Example 11 until a SiO$_2$ (insulating layer) is formed on a tungsten layer (second metal wiring layer) and a PHS-r-PMMA/PHS thin film (guide layer) with an L&S pattern is formed.

Next, the top of the PHS-r-PMMA/PHS thin film (guide layer) is spin-coated with an ethyl lactate solution (concentration of 2 wt %) of a poly(4-hydroxystyrene)-polymethyl methacrylate block copolymer (PHS-b-PMMA) (block copolymer layer) at a speed of revolution of 2000 rpm. It should be noted that the PHS-b-PMMA used has a molar weight Mn=122,000, a polydispersity Mw/Mn=1.08, and a volume fraction $f_{PHS}$=0.5.

After a solvent contained in the PHS-b-PMMA thin film is eliminated at 110° C./90 sec, annealing is performed at 200° C./8 h for separating PHS-b-PMMA into a PHS phase (first phase) and a PMMA phase (second phase).

Subsequently, observation is performed by AFM for confirming the pattern. When the AFM observation is performed, it is found that an L&S pattern with a cycle of 50 nm has been formed.

Next, the PMMA phase (second phase) is selectively eliminated with respect to the PHS phase (first phase). At this time, the PHS-r-PMMA/PHS thin film (guide layer) as a lower layer of the PMMA phase (second layer) is also eliminated by etching until the surface of SiO$_2$ (insulating layer) is exposed.

Next, tungsten (metal) is formed on the whole surface. Subsequently, tungsten is exposed by CMP on the surface of the PHS phase (first phase). Thereafter, the PHS phase (first phase) and the PHS-r-PMMA/PHS thin film (guide layer) are removed by etching. When observation is performed by the cross-sectional SEM, wiring of tungsten is formed on SiO$_2$ (insulating layer).

Example 14

Hereinafter, there will be described a specific example of the manufacturing method of the fourth embodiment.

A memory device is manufactured by a similar manufacturing method to that of Example 13 except that the manufacturing method in Example 13, in which a PHS-r-PMMA/PHS thin film (guide layer) with an L&S pattern is formed and the PHS phase (first phase) and the PHS-r-PMMA/PMMA thin film (guide layer) are removed by etching, is replaced by the following method.

Irradiation is performed with UV light by the low-pressure mercury lamp for five minutes to induce a hydroxyl group on the surface of SiO$_2$ (insulating layer). The Si-substrate after the UV treatment is spin-coated with a PGMEA solution (concentration of 0.5 wt %) of polysthyrene-polymethyl methacrylate random copolymer (PS-r-PMMA) of a hydroxyl group having a hydroxyl group at one end at a speed of revolution of 2000 rpm. It should be noted that the PS-r-PMMA used has a molar weight Mn=50,000, a polydispersity Mw/Mn=1.05, and a volume fraction $f_{PMMA}$=0.5.

After a solvent contained in the PS-r-PMMA thin film is eliminated at 110° C./90 sec, annealing is performed at 150° C./8 h for producing crosslinking reaction between a hydroxyl group on the surface of the Si-substrate and PS-r-PMMA. Subsequently, non-crosslinked excess PS-r-PMMA is rinsed by PGMEA. When a contact angle of the PHS-r-PMMA thin film on water is evaluated, it is found to be almost a medium of 80° between a contact angle of 87.5° of a PS thin film and a contact angle of 70° of PMMA. Further, when a film thickness of the PS-r-PMMA thin film is evaluated by AFM, it can be confirmed to be about 5 nm.

Next, an L&S guide pattern is made on the PS-r-PMMA thin film by photo lithography. The top of the PS-r-PMMA thin film is spin-coated at 1500 rpm/30 sec by use of SOG080 manufactured by JSR Corporation to form an SOG (Spin On Glass) layer (film thickness: 45 nm). Subsequently, a photoresist for ArF is spin-coated at 1500 rpm/35 sec, and pre-baked at 120° C./90 sec. A photoresist/SOG/PS-r-PMMA stacked film is exposed with an L&S pattern by the ArF excimer laser exposure device. An exposure value is set to 25 mJ/cm$^2$, and a pattern cycle is set to 100 nm. After PEB (Post Exposure Bake) is performed at 125☐/60 sec, development is performed at 2.38% TMAH (Tetra Methyl Ammonium Hydroxide).

Thereafter, RIE is performed with O$_2$, and the RIE is performed on the SOG layer and the PS-r-PMMA thin film with a fluorine-based gas until the Si-surface of the substrate appears. Then, residues of the photoresist, the SOG and the like are eliminated by TMY (Trimethyl-2-hydroxyethyl ammonium hydroxide). When the formed PS-r-PMMA thin film pattern (first region) is observed by SEM, it is found to be an L&S (Line & Space) pattern with a cycle of 100 nm.

Further, irradiation is performed with UV light by the low-pressure mercury lamp for five minutes to induce a hydroxyl group on the surface of SiO$_2$ (insulating layer). The SiO$_2$ (insulating layer) after the UV treatment is spin-coated with a PGMEA solution (concentration of 0.5 wt %) of polymethyl methacrylate (PMMA-OH) having a hydroxyl group at one end at a speed of revolution of 2000 rpm. It should be noted that the PMMA-OH used has a molar weight Mn=50,000 and a polydispersity Mw/Mn=1.05.

After a solvent contained in the PMMA-OH thin film is eliminated at 110° C./90 sec, annealing is performed at 150° C./8 h for producing crosslinking reaction between a hydroxyl group on the surface of the Si-substrate and PMMA-OH. Subsequently, non-crosslinked excess PMMA-OH is rinsed by ethyl lactate. The exposed Si-surface is covered by a PMMA thin film (second region) having a thickness of about 5 nm.

Next, the top of the PS-r-PMMA/PMMA thin film (guide layer) is spin-coated with a PGMEA solution (concentration of 2 wt %) of a polysthyrene-polymethyl methacrylate block copolymer (PS-b-PMMA) (block copolymer layer) at a speed of revolution of 2000 rpm. It should be noted that the PS-b-PMMA used has a molar weight Mn=122,000, a polydispersity Mw/Mn=1.08, and a volume fraction $f_{PHS}$=0.5.

After a solvent contained in the PS-b-PMMA thin film is eliminated at 110° C./90 sec, annealing is performed at 200° C./8 h for separating PS-b-PMMA into a PS phase (first phase) and a PMMA phase (second phase). Subsequently, observation is performed by AFM for confirming the pattern. When the AFM observation is performed, it is found that an L&S pattern with a cycle of 50 nm has been formed.

Next, the PMMA phase (second phase) is selectively eliminated with respect to the PS phase (first phase). At this time, the PS-r-PMMA/PMMA thin film (guide layer) as a lower layer of the PMMA phase (second layer) is also eliminated by etching until the surface of $SiO_2$ (insulating layer) is exposed.

Next, tungsten (metal) is formed on the whole surface. Subsequently, tungsten is exposed by CMP on the surface of the PS phase (first phase). Thereafter, the PS phase (first phase) and the PS-r-PMMA/PMMA thin film (guide layer) are removed by etching.

When observation is performed by the cross-sectional SEM, wiring of tungsten is formed on $SiO_2$ (insulating layer).

Example 15

Hereinafter, there will be described a specific example of the manufacturing method of the fourth embodiment.

A memory device is manufactured by a similar manufacturing method to that of Example 12 until a $SiO_2$ (insulating layer) is formed on the tungsten layer (second metal wiring layer) as an upper layer in Example 12.

Irradiation is performed with UV light by the low-pressure mercury lamp for five minutes to induce a hydroxyl group on the surface of $SiO_2$ (insulating layer). The Si-substrate after the UV treatment is spin-coated with a PGMEA solution (concentration of 0.5 wt %) of polysthyrene-polymethyl methacrylate random copolymer (PS-r-PMMA) of a hydroxyl group having a hydroxyl group at one end at a speed of revolution of 2000 rpm. It should be noted that the PS-r-PMMA used has a molar weight Mn=50,000, a polydispersity Mw/Mn=1.05, and a volume fraction $f_{PMMA}$=0.5.

After a solvent contained in the PS-r-PMMA thin film is eliminated at 110° C./90 sec, annealing is performed at 150° C./8 h for producing crosslinking reaction between a hydroxyl group on the surface of the Si-substrate and PS-r-PMMA. Subsequently, non-crosslinked excess PS-r-PMMA is rinsed by PGMEA. When a contact angle of the PHS-r-PMMA thin film on water is evaluated, it is found to be almost a medium of 80° between a contact angle of 87.5° of a PS thin film and a contact angle of 70° of PMMA.

Further, when a film thickness of the PS-r-PMMA thin film is evaluated by AFM, it can be confirmed to be about 5 nm.

Next, an L&S guide pattern is made on the PS-r-PMMA thin film by photo lithography. The top of the PS-r-PMMA thin film is spin-coated at 1500 rpm/30 sec by use of SOG080 manufactured by JSR Corporation, to form an SOG (Spin On Glass) layer (film thickness: 45 nm). Subsequently, a photoresist for ArF is spin-coated at 1500 rpm/35 sec, and pre-baked at 120° C./90 sec. A photoresist/SOG/PS-r-PMMA stacked film is exposed with an L&S pattern by the ArF excimer laser exposure device. An exposure value is set to 25 mJ/cm$^2$, and a pattern cycle is set to 100 nm. After PEB (Post Exposure Bake) is performed at 125° C./60 sec, development is performed at 2.38% TMAH (Tetra Methyl Ammonium Hydroxide).

Thereafter, RIE is performed with $O_2$, and the RIE is performed on the SOG layer and the PS-r-PMMA thin film with a fluorine-based gas until the Si-surface of the substrate appears. Then, residues of the photoresist, the SOG and the like are eliminated by TMY (Trimethyl-2-hydroxyethyl ammonium hydroxide). When the formed PS-r-PMMA thin film pattern (first region) is observed by SEM, it is found to be an L&S (Line & Space) pattern with a cycle of 100 nm.

Further, irradiation is performed with UV light by the low-pressure mercury lamp for five minutes to induce a hydroxyl group on the surface of $SiO_2$ (insulating layer). The $SiO_2$ (insulating layer) after the UV treatment is spin-coated with a PGMEA solution (concentration of 0.5 wt %) of polymethyl methacrylate (PMMA-OH) having a hydroxyl group at one end at a speed of revolution of 2000 rpm. It should be noted that the PMMA-OH used has a molar weight Mn=50,000 and a polydispersity Mw/Mn=1.05. After a solvent contained in the PMMA-OH thin film is eliminated at 110° C./90 sec, annealing is performed at 150° C./8 h for producing crosslinking reaction between a hydroxyl group on the surface of the Si-substrate and PMMA-OH. Subsequently, non-crosslinked excess PMMA-OH is rinsed by ethyl lactate. The exposed Si-surface is covered by a PMMA thin film (second region) having a thickness of about 5 nm.

Next, the top of the PS-r-PMMA/PMMA thin film (guide layer) is spin-coated with a PGMEA solution (concentration of 2 wt %) of a polysthyrene-polymethyl methacrylate block copolymer (PS-b-PMMA) (block copolymer layer) at a speed of revolution of 2000 rpm. It should be noted that the PS-b-PMMA used has a molar weight Mn=122,000, a polydispersity Mw/Mn=1.08, and a volume fraction $f_{PHS}$=0.5.

After a solvent contained in the PS-b-PMMA thin film is eliminated at 110° C./90 sec, annealing is performed at 200° C./8 h for separating PS-b-PMMA into a PS phase (first phase) and a PMMA phase (second phase). Subsequently, observation is performed by AFM for confirming the pattern. When the AFM observation is performed, it is found that an L&S pattern with a cycle of 50 nm has been formed.

Next, the PMMA phase (second phase) is selectively eliminated with respect to the PS phase (first phase). At this time, the PS-r-PMMA/PMMA thin film (guide layer) as a lower layer of the PMMA phase (second layer) is also eliminated by etching until the surface of $SiO_2$ (insulating layer) is exposed.

Next, tungsten (metal) is formed on the whole surface. Subsequently, tungsten is exposed by CMP on the surface of the PS phase (first phase). Thereafter, the PS phase (first phase) and the PS-r-PMMA/PMMA thin film (guide layer) are removed by etching.

When observation is performed by the cross-sectional SEM, wiring of tungsten is formed on SiO$_2$ (insulating layer).

Although the cases have been described in the embodiments and the examples where the memory layer is the organic molecular layer, when resistance changes by application of a voltage, another material such as a metal oxide layer can also be used.

While certain embodiments have been described, these embodiments have been presented by way of example only, and are not intended to limit the scope of the inventions. Indeed, method for manufacturing memory device and a method for manufacturing metal wiring described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a memory device, comprising:
    forming a block copolymer layer on a substrate, the block copolymer layer containing a first polymer and a second polymer having a lower surface energy than that of the first polymer;
    performing a thermal treatment on the block copolymer layer, the thermal treatment separating the block copolymer layer such that a first phase containing the first polymer and extending in a first direction and a second phase containing the second polymer and extending in the first direction are alternately arrayed;
    forming a first metal wiring layer selectively on the first phase, the first metal wiring layer extending in the first direction;
    forming a memory layer on the first metal wiring layer, a resistance of the memory layer being changed by application of a voltage; and
    forming a second metal wiring layer on the memory layer, the second metal wiring layer extending in a second direction, the second direction intersecting the first direction.

2. The method according to claim 1, wherein the first polymer contains as a side chain a functional group selected from a group consisting of a pyridine ring, a hydroxyl group, a carboxyl group, an amino group, an amide group, and an isocyanate group, and the second polymer does not contain the functional group.

3. The method according to claim 1, wherein the first polymer is a polystyrene derivative, and the second polymer is a polymethacrylate derivative.

4. The method according to claim 1, further comprising forming a metal oxide film on the first phase before forming the first metal wiring layer, the metal oxide film having a thickness of 1 nm or less.

5. The method according to claim 1, further comprising forming a guide layer on the substrate before forming the block copolymer layer, the guide layer having a first region and a second region, the first region extending in the first direction, the second region having a lower surface energy than that of the first region and extending in the first direction, and the first region and the second region being alternately arrayed,
    wherein the first polymer has a larger surface energy than that of the second region and the second polymer has a smaller surface energy than that of the second region.

6. The method according to claim 1, further comprising forming a guide layer on the substrate before forming the block copolymer layer, the guide layer having a groove extending in the first direction,
    wherein the block copolymer layer is formed in the groove.

7. The method according to claim 1, wherein the first metal wiring layer is formed by atomic layer deposition or electroless plating.

8. The method according to claim 1, wherein the memory layer includes an organic molecular layer containing organic molecules having a resistance change type molecular chain selectively chemically bonded with the first metal wiring layer.

9. The method according to claim 1, further comprising forming a metal oxide layer on the first metal wiring layer by atomic layer deposition after forming the first metal wiring layer and before forming the memory layer.

10. The method according to claim 1, further comprising forming a metal oxide layer on the memory layer by atomic layer deposition after forming the memory layer and before forming the second metal wiring layer.

11. A method for manufacturing metal wiring, comprising:
    forming a block copolymer layer on a substrate, the block copolymer layer containing a first polymer and a second polymer having a lower surface energy than that of the first polymer;
    performing a thermal treatment on the block copolymer layer, the thermal treatment separating the block copolymer layer such that a first phase containing the first polymer and extending in a first direction and a second phase containing the second polymer and extending in the first direction are alternately arrayed, and
    forming a metal wiring layer selectively on the first phase, the metal wiring layer extending in the first direction,
    wherein the first polymer contains as a side chain a functional group selected from a group consisting of a pyridine ring, a hydroxyl group, a carboxyl group, an amino group, an amide group, and an isocyanate group, and the second polymer does not contain the functional group, and
    wherein the first polymer is a polystyrene derivative, and the second polymer is a polymethacrylate derivative.

12. The method according to claim 11, further comprising forming a metal oxide film on the first phase before forming the metal wiring layer, the metal oxide film having a thickness of 1 nm or less.

13. The method according to claim 11, further comprising forming a guide layer on the substrate before forming the block copolymer layer, the guide layer having a first region and a second region, the first region extending in the first direction, the second region having a lower surface energy than that of the first region and extending in the first direction, and the first region and the second region being alternately arrayed,
    wherein the first polymer has a larger surface energy than that of the second region and the second polymer has a smaller surface energy than that of the second region.

14. The method according to claim 11, further comprising forming a guide layer on the substrate before forming the block copolymer layer, the guide layer having a groove extending in the first direction,
    wherein the block copolymer layer is formed in the groove.

15. The method according to claim 11, wherein the metal wiring layer is formed by atomic layer deposition or electroless plating.

\* \* \* \* \*